United States Patent
Kim

(10) Patent No.: US 9,570,147 B2
(45) Date of Patent: Feb. 14, 2017

(54) SEMICONDUCTOR PACKAGE WITH POP STRUCTURE AND REFRESH CONTROL METHOD THEREOF

(71) Applicant: Il-Joon Kim, Seoul (KR)

(72) Inventor: Il-Joon Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/964,532

(22) Filed: Dec. 9, 2015

(65) Prior Publication Data

US 2016/0203854 A1  Jul. 14, 2016

(30) Foreign Application Priority Data

Jan. 9, 2015  (KR) .................. 10-2015-0003596

(51) Int. Cl.
| | | |
|---|---|---|
| *G11C 7/00* | (2006.01) | |
| *G11C 11/406* | (2006.01) | |
| *H01L 25/18* | (2006.01) | |
| *H01L 25/065* | (2006.01) | |
| *G11C 5/04* | (2006.01) | |

(52) U.S. Cl.
CPC .... *G11C 11/40626* (2013.01); *G11C 11/40618* (2013.01); *H01L 25/0657* (2013.01); *H01L 25/18* (2013.01); *G11C 5/04* (2013.01); *G11C 2211/4061* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2225/06541* (2013.01); *H01L 2924/0002* (2013.01); *H01L 2924/15311* (2013.01); *H01L 2924/181* (2013.01)

(58) Field of Classification Search
CPC ................... G11C 11/40626; G11C 11/40618; H01L 25/0657; H01L 25/18; H01L 2225/06541
USPC ........ 365/222, 211, 189.011, 189.17, 230.03
See application file for complete search history.

(56) References Cited

U.S. PATENT DOCUMENTS

| | | |
|---|---|---|
| 6,483,764 B2 | 11/2002 | Hsu et al. |
| 6,751,143 B2 | 6/2004 | Morgan et al. |
| 7,002,864 B2 | 2/2006 | Kim et al. |

(Continued)

FOREIGN PATENT DOCUMENTS

KR    1020050120344 A    12/2005

*Primary Examiner* — Fernando Hidalgo
(74) *Attorney, Agent, or Firm* — Renaissance IP Law Group LLP

(57) ABSTRACT

A refresh control method of a semiconductor package, comprising: providing a semiconductor package including a first semiconductor chip and a second semiconductor chip; monitoring a temperature of each of a plurality of sensing areas of the first semiconductor chip when the first semiconductor chip operates; identifying at least one memory bank of the second semiconductor chip corresponding to an area having a lower temperature among the sensing areas; controlling the second semiconductor chip to transfer data to the identified memory bank from another memory bank of the second semiconductor chip; and controlling a refresh operation of the second semiconductor chip such that a period of a refresh operation on the identified memory bank is greater than that of a period of a refresh operation on the other memory bank.

17 Claims, 17 Drawing Sheets

(56) References Cited

U.S. PATENT DOCUMENTS

| | | |
|---|---|---|
| 7,027,343 B2 | 4/2006 | Sinha et al. |
| 8,174,921 B2 | 5/2012 | Kim et al. |
| 8,192,082 B2 | 6/2012 | Song et al. |
| 8,787,105 B2 | 7/2014 | Chen |
| 9,442,551 B2 * | 9/2016 | Tomi .................. G06F 1/206 |
| 2002/0136075 A1 | 9/2002 | Hsu et al. |
| 2003/0193829 A1 | 10/2003 | Morgan et al. |
| 2004/0233758 A1 | 11/2004 | Kim et al. |
| 2005/0063234 A1 | 3/2005 | Sinha et al. |
| 2007/0145578 A1 | 6/2007 | Lee |
| 2008/0169860 A1 | 7/2008 | Song |
| 2009/0168840 A1 | 7/2009 | Song et al. |
| 2010/0157709 A1 | 6/2010 | Kim et al. |
| 2012/0254519 A1 * | 10/2012 | Ellis .................. G06F 12/0246 |
| | | 711/103 |
| 2013/0114364 A1 * | 5/2013 | Sakakibara ....... G11C 11/40618 |
| | | 365/222 |
| 2013/0275665 A1 * | 10/2013 | Saraswat ................ G11C 7/04 |
| | | 711/106 |
| 2013/0301371 A1 | 11/2013 | Chen |
| 2014/0140156 A1 | 5/2014 | Shoemaker et al. |

* cited by examiner

SEMICONDUCTOR PACKAGE WITH POP STRUCTURE AND REFRESH CONTROL METHOD THEREOF

CROSS-REFERENCE TO RELATED APPLICATIONS

This US non-provisional patent application claims priority under 35 USC §119 to Korean Patent Application No. 10-2015-0003596, filed on Jan. 9, 2015, the entirety of which is hereby incorporated by reference.

BACKGROUND

The present disclosure relates to semiconductor packages and, more particularly, to a semiconductor package with a PoP structure and a refresh control method thereof.

A dynamic random access memory (DRAM) may be used as a main memory of an application processor (hereinafter referred to as "AP") or a central processing unit (CPU).

There is an increasing demand for lower power consumption in a mobile DRAM for use in a mobile device such as a smartphone.

Since a DRAM is characterized in that charges charged to a storage capacitor constituting a memory cell leak with the passage of time, the DRAM periodically requires a refresh operation to recharge the charges within a certain time.

Power consumed for a refresh operation of a DRAM is one of the parts of power consumed in the DRAM. One of the ways to reduce power consumed for a refresh operation is to extend a period of the refresh operation. The frequency of the refresh operation is proportional to the amount of leakage current at a storage capacitor constituting a DRAM memory cell and is exponentially proportional to operation temperature. As a result, larger the amount of the leakage current and the higher the operation temperature, the more frequently the refresh operation must be performed.

Along with the request for higher performance of state-of-the-art mobile devices, the stacking technology of semiconductor chips and the stacking technology of semiconductor packages have been developed.

SUMMARY

A refresh control method of a semiconductor package, comprising: providing a semiconductor package including a first semiconductor chip and a second semiconductor chip; monitoring a temperature of each of a plurality of sensing areas of the first semiconductor chip when the first semiconductor chip operates; identifying at least one memory bank of the second semiconductor chip corresponding to an area having a lower temperature among the sensing areas; controlling the second semiconductor chip to transfer data to the identified memory bank from another memory bank of the second semiconductor chip; and controlling a refresh operation of the second semiconductor chip such that a period of a refresh operation on the identified memory bank is greater than that of a period of a refresh operation on the other memory bank.

A refresh control method of a semiconductor package, the refresh control method comprising: providing a semiconductor package including a first semiconductor chip and including a second semiconductor chip as a memory chip; monitoring a temperature of each of a plurality of sensing areas of the second semiconductor chip when the first semiconductor chip operates as a system-on-chip; identifying at least one memory bank of the second semiconductor chip corresponding to an area having a lower temperature among the sensing areas; controlling the second semiconductor chip to transfer data stored in a memory bank other than the identified at least one memory bank to the identified at least one memory bank; and controlling a refresh operation of the second semiconductor chip such that a period of a refresh operation on the identified at least one memory bank is made longer than that of a refresh operation on the memory bank other than the identified at least one memory bank.

A method, comprising: sensing a plurality of temperatures associated with a plurality of memory banks of one or more semiconductor chips; and transferring data among the memory banks in response to the sensed temperatures.

BRIEF DESCRIPTION OF THE DRAWINGS

The accompanying drawings are included to provide a further understanding of the disclosure, and are incorporated in and constitute a part of this specification. The drawings illustrate particular embodiments and, together with the description, serve to explain principles of the embodiments. In the drawings.

DETAILED DESCRIPTION

Figure 1:
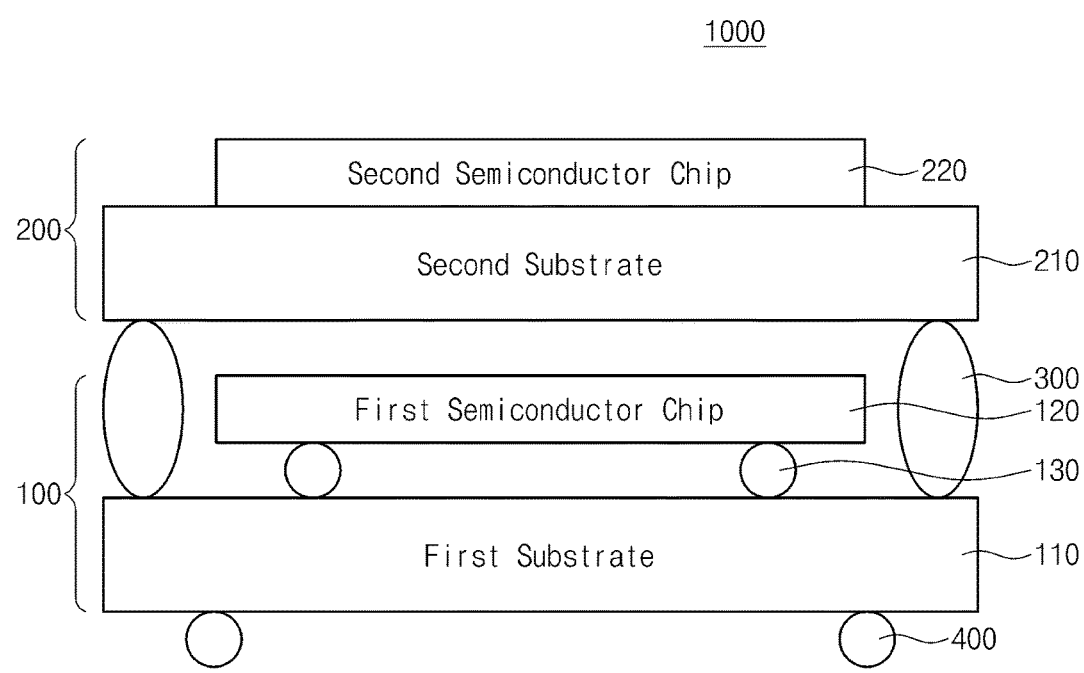
FIG. 1 illustrates a semiconductor package with a PoP structure according to some embodiments.

Embodiments will now be described more fully through the following particular embodiments related to the accompanying drawings. However, embodiments are not limited to these particular embodiments but may be take other forms.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," "on" versus "directly on," etc.).

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope.

Relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a", "an", and the are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment, and the details of basic data access operations to a DRAM or a memory module and internal function circuits and the details of a module structure and a structure or shape of a module tab area may not be described in order not to make the subject matter of the disclosure ambiguous.

FIG. 1 illustrates a semiconductor package 1000 with a PoP structure according to some embodiments. As illustrated, the semiconductor package 1000 may include a first package 100 including a first semiconductor chip 120 and a second package 200 including a second semiconductor chip 220. The second package 200 may be disposed on the first package 100. Thus, the package shown in FIG. 1 may have a package-on-package (PoP) structure.

The first semiconductor chip 120 may be a logic chip disposed on a first substrate 110 in the form of system-on-chip (SoC).

The logic chip may be an SoC type application processor (AP) for use in a mobile system, for example, a mobile phone, an MP3 player, a navigation system, and a portable multimedia player (PMP). The logic chip may be a microprocessor, for example, a central processing unit (CPU), a controller, or an application specific integrated circuit (ASIC). Although particular examples of the logic chip have been given, in other embodiments the logic chip may have a different form or may be usable in different applications.

The second semiconductor chip 220 may include a memory chip such as a dynamic random access memory (DRAM) that is formed on a second semiconductor substrate 210 and includes a plurality of memory banks. The memory chip may be a double data rate (DDR) synchronous dynamic random access memory (SDRAM) chip (hereinafter referred to as "DDR chip") for use in a mobile system. Although a particular type of memory has been used as an example, other types of memory may be used, including memories having higher power consumption at higher temperatures.

A connection member 130 electrically connects the first substrate 110 and the first semiconductor chip 120 to each other.

A connection member 300 electrically connects the first substrate 110 and the second substrate 210 to each other.

An external connection member 400 electrically connects the first substrate 110 and an external substrate such as a mainboard to each other.

The second semiconductor chip 220 may have a multi-chip package (MCP) structure using a silicon-through-via (TSV) when including a plurality of layers stacked.

When the first semiconductor chip 120 operates as a system-on-chip, the first semiconductor chip 120 may monitor temperature at each of set sensing areas of the semiconductor chip 120.

A thermal sensor used to monitor the temperature may be disposed in plurality between the first substrate 110 and the first semiconductor chip 120. In this case, the thermal sensor may be disposed above the first substrate 110 to sense spot-dependent temperature according to heating of the first semiconductor chip 120.

The thermal sensor used to monitor the temperature may be disposed between the first semiconductor chip 120 and the second substrate 210 according to the number of predetermined sensing areas. In this case, the thermal sensor may be disposed below the second substrate 210 to sense spot-dependent temperature according to heating of the first semiconductor chip 120.

For example, when a CPU of the first semiconductor chip 120 operates and a GPU is in an idle state, temperature of a spot where the CPU exists may be higher than that of a spot where the GPU exists. On the other hand, when the CPU of the first semiconductor chip 120 is in a standby state and the GPU is in a full-operation state, temperature of a spot where the GPU exists may be higher than that of a spot where the CPU exists. For brevity of description, a spot having relatively high temperature will be hereinafter referred to as a hot spot and a spot having relatively low temperature will be hereinafter referred to a cold spot. Furthermore, a location of a hot spot and a cold spot may change overtime, for example, when a CPU of the first semiconductor chip 120 transitions from operating to a standby state and a GPU transitions from an idle state to an operating state. Moreover, although a single CPU and a single GPU have been used as examples and although a single hot spot and a single cold spot have been used as an example, any number of heat-generating portions of the first semiconductor chip 120 may be present, each of which may be operating in a state that generates a hot or cold spot. Thus, any number of hot or cold spots may be present during operation of the first semiconductor chip 120 and the location and number of those spots may change over time.

The first semiconductor chip 120 may be configured to decide at least one memory bank of the second semiconductor chip 220 that corresponds to an area having the lowest temperature among the sensing areas. A memory bank of the second semiconductor chip 220 that physically corresponds to the spot where the GPU is disposed will be hereinafter referred to as a third memory bank. For example, when it is sensed that temperature of a spot where the GPU is disposed is lowest, the first semiconductor chip 120 may be configured to identify the third memory bank as a memory bank corresponding to the area having the lowest temperature among the sensing areas. As mentioned above, one memory bank is identified. However, some embodiments are not limited thereto and multiple memory banks may be identified as a memory bank corresponding to an area having the lowest or a lower temperature among the sensing areas.

Since the first semiconductor chip 120 may also be configured to function as a memory controller, it may control read, write, and refresh operations of the second semiconductor chip 220. Thus, the first semiconductor chip 120 may be configured to control the second semiconductor chip 220 to transfer or copy data stored in a memory bank except for the identified memory bank to the identified memory bank. For example, during data transfer, data stored in a first memory bank including hot data may be transferred to a third memory bank including cold data. The term "hot data" means data stored in a memory bank that physically corresponds to a sensing area sensed at relatively high temperature, while the term "cold data" means data stored in a memory bank that physically corresponds to a sensing area sensed at relatively low temperature. In some embodiments, hot data of a memory bank corresponding to a hot spot is collected to a memory bank where cold data exists to convert the hot data into the cold data, which will be hereinafter referred to as "hot data collection".

The first semiconductor chip 120 may be configured to control a refresh operation of the second semiconductor chip 220 such that a period of a refresh operation on the identified memory bank is made longer than that of a refresh operation on a memory bank except for the identified memory bank.

For example, when the second semiconductor chip 220 includes four memory banks and cold data is included in the third memory bank, a period of a refresh operation on the third memory bank may be controlled to be longest. Thus, power consumed in the refresh operation of the third memory bank is reduced.

In addition, when the memory bank including the hot data is emptied by transferring hot data of a memory bank corresponding to the hot spot among the memory banks to the identified memory bank, a refresh operation on the emptied memory bank may be controlled to be inhibited. Accordingly, there is no power consumed in a refresh operation associated with the emptied memory bank.

In some embodiments, power consumed in a refresh operation of a memory bank or memory banks including cold data is reduced and there is no power consumed in a refresh operation of a memory bank or memory banks in which hot data exists. Thus, power consumption of a semiconductor package with a PoP structure is reduced or minimized. Accordingly, in some embodiments, a semiconductor product may have improved operation performance and lower power consumption in the form of a hybrid package.

Although a single cold memory bank and a single hot memory bank have been used an example, any number of hot and cold memory banks may be identified. Thus data may be transferred from the hot memory banks to the cold memory banks.

Figure 2:
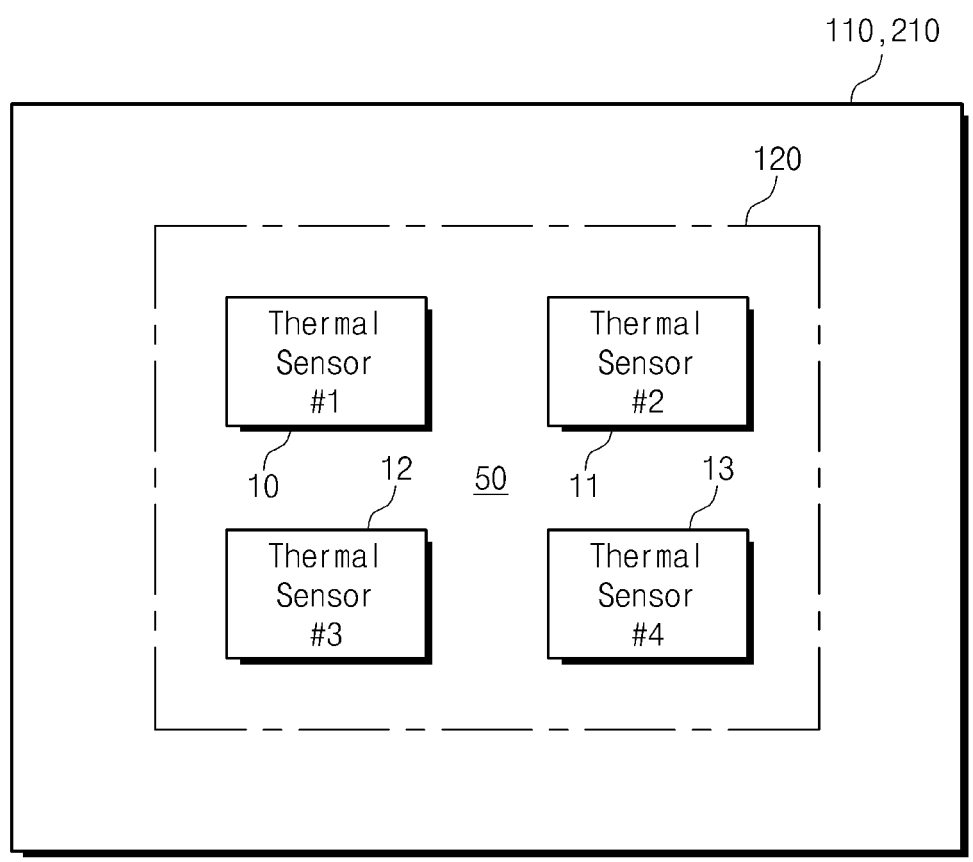
FIG. 2 illustrates arrangement concept of thermal sensors mounted in FIG. 1 according to some embodiments.

FIG. 2 illustrates arrangement concept of thermal sensors mounted in FIG. 1 according to some embodiments. In FIG. 2, four thermal sensors 10, 11, 12, and 13 mounted on a first substrate 110 or a second substrate 210 are shown. However, the four thermal sensors 10, 11, 12, and 13 shown in FIG. 2 are merely exemplary, and other embodiments are not limited thereto and the number, position, type, configuration, or the like of thermal sensors may be different. For example, when eight memory banks exist, eight thermal sensors may be disposed. A thermal sensing unit 50 is disposed within a plane size of a first semiconductor chip 120 to sense a heating spot of the first semiconductor chip 120. The thermal sensing unit 50 may be disposed above, below, beside or within a first substrate 110 as a semiconductor temperature sensor. The thermal sensing unit 50 may be disposed above, below, beside or within a second substrate 210 as a semiconductor temperature sensor.

Figure 3:
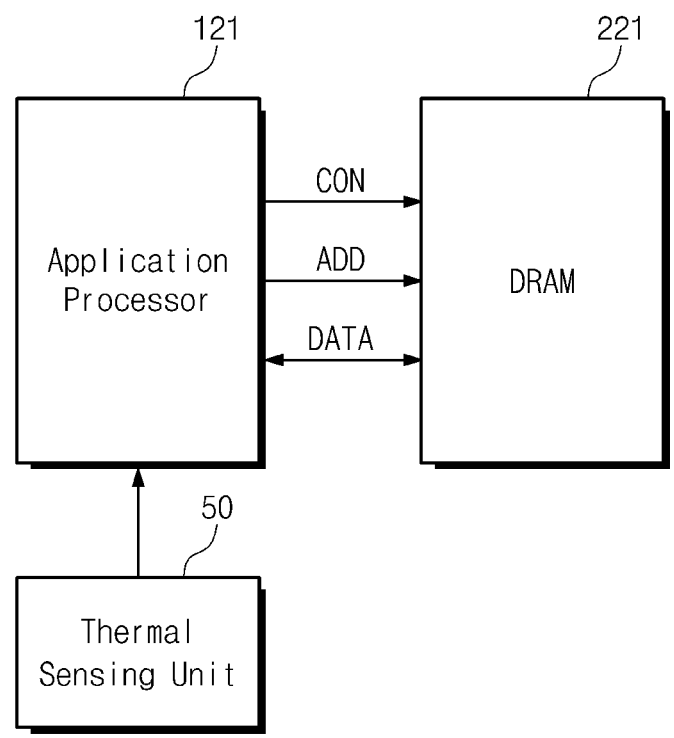
FIG. 3 is a circuit block diagram of the semiconductor package with the PoP structure according to FIG. 1.

FIG. 3 is a circuit block diagram of the semiconductor package with the PoP structure according to FIG. 1. As illustrated, the semiconductor package may include an application processor 121 and a DRAM 221. The application processor 121 may be configured to receive temperature data of a thermal sensing unit 50. The temperature data may be data output independently from four thermals sensors 10, 11, 12, and 13 when a plane size within which the application processor 121 is disposed is divided as shown in FIG. 2.

The application processor 121 may be configured to apply a control signal CON including a command to the DRAM 221. The application processor 121 may be configured to apply an address ADD for selecting a memory bank and a memory cell to the DRAM 221. The application processor 121 may be configured to apply write data DATA to the DRAM 221 to store data in a selected storage area, e.g., a memory bank or a memory cell of the DRAM 221. The application processor 121 may be configured to receive read data DATA from the DRAM 221.

The application processor 121 may be configured to manage an address mapping table to indicate a data transfer path when controlling the DRAM 221 to transfer data stored in a memory bank except for a memory bank identified as a cold bank to the identified memory bank. That is, an address mapping table may be provided in an internal buffer area of the application processor 121 to know which address data of what bank is transferred to a currently designated cold bank when hot data collection is performed. In order to prepare for power-off, data constituting an address mapping table stored in the buffer area may be stored in a nonvolatile memory (e.g., flash memory) disposed inside or outside the application processor 121.

A temperature at each sensing area may be monitored in each predetermined monitoring period by the application processor 121 to perform hot data collection and a refresh control operation on a cold memory bank. In addition, the temperature at each sensing area may be monitored based on management data obtained by counting the number of data access operations (read/write command generation counts) of the DRAM 221. For example, when the number of data access operations reaches a predetermined operation count, a monitoring operation may be started to determine which memory bank is coldest or relatively cold among multiple memory banks.

In the application processor 121, a CPU may be connected to a memory controller via a bus to control the DRAM 221. In this case, an interface between the memory controller and the CPU may include various protocols for data exchange. These protocols may include one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol.

Figure 4:
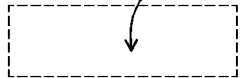
FIG. 4 is an exemplary view of an address mapping table managed according to the operation in FIG. 3.

FIG. 4 is an exemplary view of an address mapping table managed according to the operation in FIG. 3. In FIG. 4, an example of an address mapping table for four address banks is shown. In the address mapping table, BLA represents a bank logical address, BPA represents a bank physical address, and update PA represents an updated physical address.

For example, when a logical address of a first memory bank is assigned from a first address to a $5000^{th}$ address, an address of memory cell storing a physical address, i.e., data of the first memory bank may be, for example, a $500^{th}$ address to a $5500^{th}$ address.

In this case, when a sensing area of the application processor 121 corresponding to the first memory bank is a hot spot and a sensing area of the application processor 121 corresponding to a second memory bank is a cold spot, hot data may be transferred to the second memory bank. Thus, a physical address is updated and its result is stored in an updated physical address area in the address mapping table. The application processor 121 may be configured to confirm an updated physical address area in the address mapping table to recognize which hot data in a memory bank is now cold data in the second memory bank. An arrow shown in the updated physical address area in the address mapping table in FIG. 4 shows translation of an updated physical address according to hot data collection.

Figure 5:
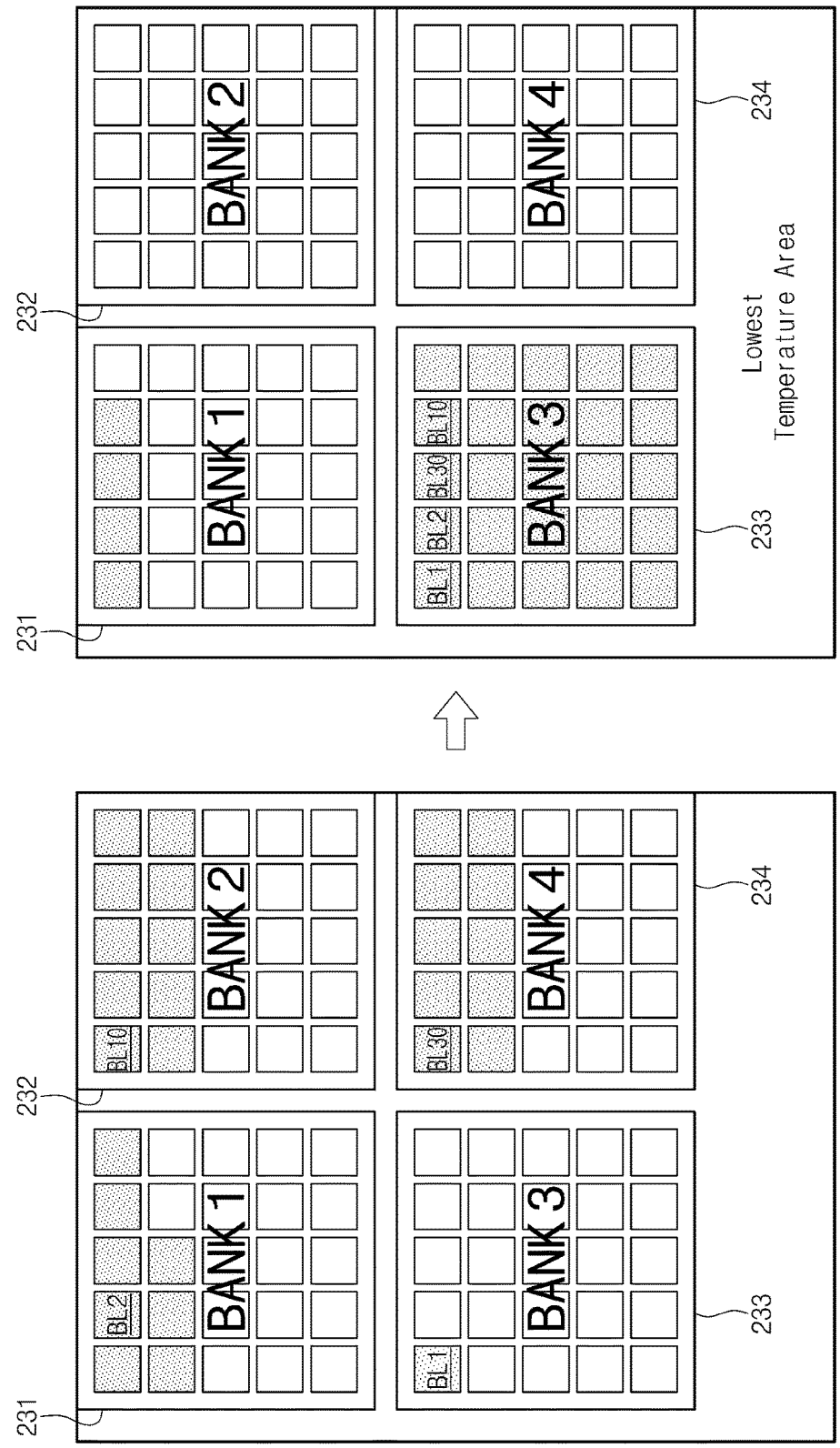
FIG. 5 is a diagram illustrating hot data collection according to the operation in FIG. 3.

FIG. 5 is a diagram illustrating hot data collection according to the operation in FIG. 3. Under the assumption that a third memory bank among four memory banks is a cold memory bank, an example of transferring hot data in first, second, and fourth memory banks 231, 232, and 234 to the third memory bank 233 is shown in FIG. 5. Although memory banks of a DRAM 221 are described as including four banks, other embodiments are not limited thereto and the number of memory banks may be present.

In this embodiment, data of a memory block BL2 of the third memory bank 233 may be a data transferred from a memory block BL2 in a first memory bank 231. Data of a memory block BL30 of the third memory bank 233 may be data transferred from a memory block BL30 in a fourth memory bank 234. Data of a memory block BL10 of the third memory bank 233 may be data transferred from a memory block BL10 in a second memory bank 232. Memory blocks BL2, BL10, and BL30 are used as examples of memory blocks that are transferred. However, multiple memory blocks may be similarly transferred.

When a hot data collection operation is performed as shown in FIG. 5, a period of a refresh operation on the third memory bank 233 may be controlled to be longer than that of a refresh operation on the first memory banks. That is, the number of refresh operations of the third memory bank 233 performed over a certain period of time is made smaller than the number of refresh operations of the first memory bank. Thus, power consumed in a refresh operation is reduced or minimized.

As a result of the hot data collection, in the case of FIG. 5, data does not exist in the second memory bank 232 and the fourth memory bank 234. Thus, in this case, a refresh operation on the second memory bank and the fourth memory bank may be controlled to be inhibited or minimized.

Figure 6:
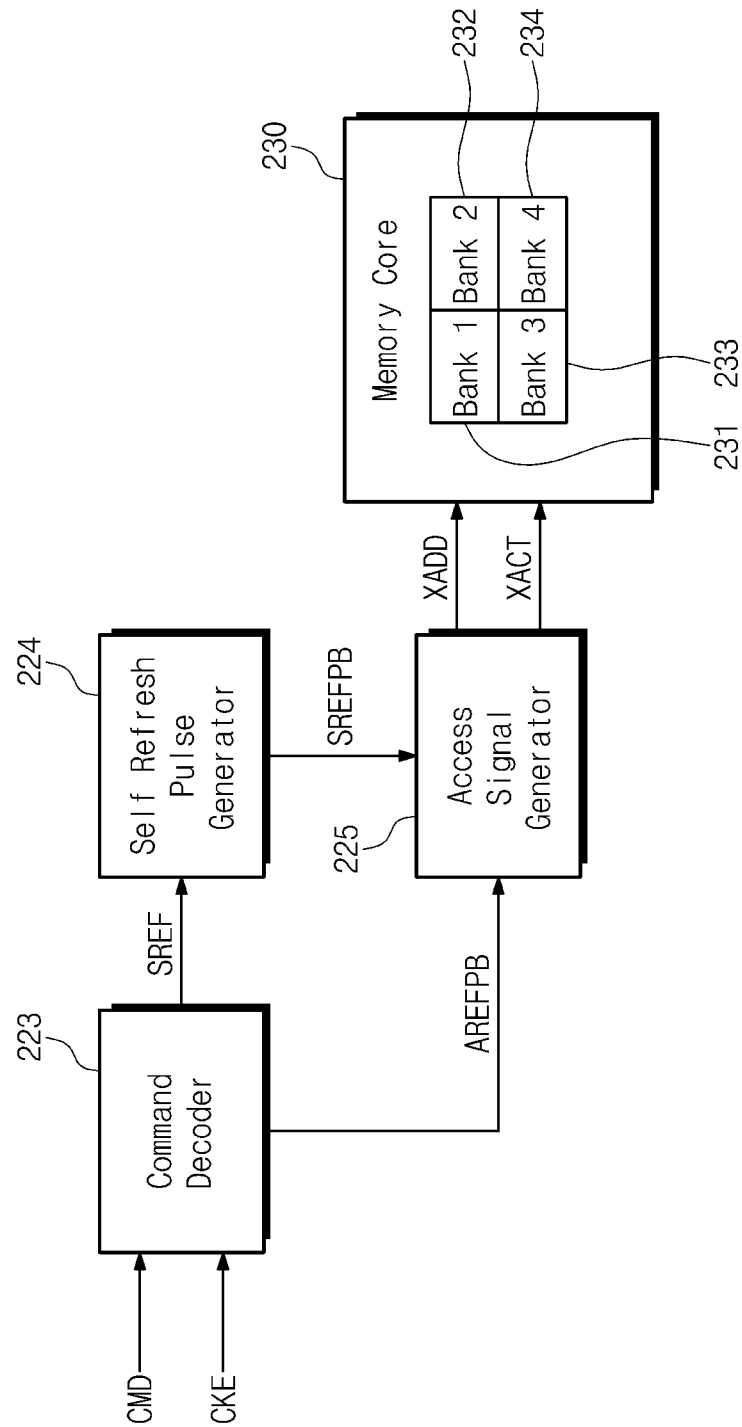
FIG. 6 is a circuit block diagram illustrating a refresh operation of a DRAM in FIG. 3.

FIG. 6 is a circuit block diagram illustrating a refresh operation of a DRAM 221 in FIG. 3.

Unlike a static random access memory (SRAM) or a flash memory, in a DRAM, leakage current causes data stored in a memory cell to be lost with the passage of time. An operation of restoring data stored in a memory cell is required in each period to prevent loss of the stored data. Such an operation is called a refresh operation. The refresh operation may include an operation of sensing and amplifying cell data after selecting a wordline one or more times for a data retention time that respective memory cells in memory banks have and an operation of rewriting the amplified cell data into a memory cell. The data retention time means time for which data can be maintained effectively without a refresh operation after storing the data in a memory cell. A refresh operation may be classified into an auto-refresh operation performed in a data access mode, i.e., normal mode of a DRAM and a self-refresh operation performed in a mode except for the data access mode, i.e., power-down mode of a DRAM. Since a self-refresh operation is conventionally performed in a power-down mode, it may have a longer period than an auto-refresh operation.

As illustrated in FIG. 6, the DRAM 221 may include a command decoder 223, a self-refresh pulse generator 224, an access signal generator 225, and a memory core 230.

The command decoder 223 may be configured to decode a command signal CMD and a clock enable signal CKE to generate a self-refresh signal SREF and an auto-refresh pulse AREFPB. The command signal CMD may include a chip selection signal/CS, a RAS signal/RAS, a CAS signal/CAS, a write enable signal/WE, or other similar signals. The command decoder 223 may be configured to decode the chip selection signal/CS, the RAS signal/RAS, the CAS signal/CAS, and the write enable signal/WE to generate the self-refresh signal SREF before toggling of a clock CLK is stopped after the clock enable signal CKE is disabled. The self-refresh signal SREF may be enabled to a logic high level when a self-refresh operation is performed.

The auto-refresh pulse AREFPB may include a pulse that is periodically generated when an auto-refresh operation is performed.

The self-refresh pulse generator 224 may be configured to generate a self-refresh pulse SREFPB in response to the self-refresh signal SREF. The self-refresh pulse SREFPB may include a pulse that is periodically generated when the self-refresh operation is performed.

The access signal generator 225 may be configured to apply a row address XADD to a memory core 230. The access signal generator 225 may be configured to output a bank active signal XACT to the memory core 230 in response the self-refresh pulse SREFPB when the self-refresh operation is performed. The access signal generator 225 may be configured to output a bank active signal XACT to the memory core 230 in response to the auto-refresh pulse AREFPB when the auto-refresh operation is performed.

The memory core 230 may include first to fourth banks 231 to 234. The memory core 230 may be configured to activate the first to fourth banks 231 to 234 in response to the bank active signal XACT. The memory core 230 may be configured to activate a wordline selected by the row address XADD when one or more banks are activated. When a corresponding wordline of a corresponding bank is activated, a refresh operation may be performed on memory cells connected to the active wordline.

In the hot data collection according to some embodiments, an auto-refresh operation period or a period of a self-refresh operation on a cold memory bank may be controlled to be relatively longer than that of a self-refresh operation on other memory banks. When an empty memory bank exists, the auto-refresh operation or the self-refresh operation may be controlled to be inhibited or minimized Thus, power consumption in a PoP package is minimized or reduced.

Figure 7:
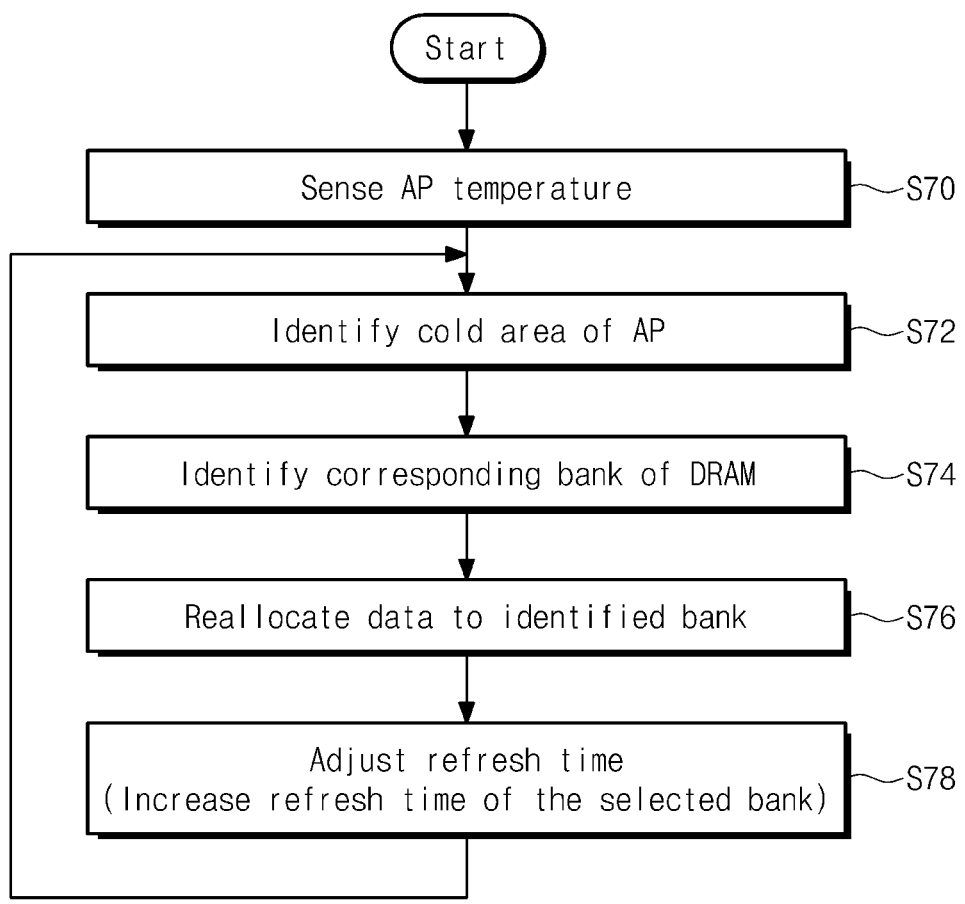
FIG. 7 is a refresh control flowchart summarizing operation of an application processor in FIG. 3 according to an embodiment.

FIG. 7 is a refresh control flowchart summarizing operation of the application processor 121 in FIG. 3 according to an embodiment. In FIG. 7, control of hot data collection and a refresh operation performed by the application processor (AP) 121 corresponding to the first semiconductor chip 120 in FIG. 1 is shown.

A temperature at each sensing area of the first semiconductor chip 120 is sensed (S70). The AP 121 receives temperature data from the thermal sensors 10, 11, 12, and 13 arranged as shown in FIG. 2.

The AP 121 identifies a coldest area among sensing areas (S72). That is, the AP 121 may identify a cold area by receiving and comparing the temperature data. In some embodiments, the cold area may be the coldest area. The AP 121 identifies a memory bank or memory banks of the DRAM 221 that physically correspond to the identified cold area (S74). For example, when the vicinity of a GPU is sensed as the cold area, a memory bank or memory banks of a physically matching DRAM 221 may be selected. Although physically matching has been used as an example of how a cold or hot area may correspond to one or more memory banks, the matching may be determined in other ways. For example, thermal matching may be used to determine the correspondence of memory banks. That is, while a particular memory bank may not physically correspond to a hot area, the memory bank may still thermally correspond to the hot area, i.e., the memory bank may be heated by the hot area.

Hot data collection may be performed (S76). Hot data is transferred to the memory bank or the memory banks of the DRAM 221 identified as a cold memory bank by reallocation of data. A refresh operation period of the cold memory bank is adjusted (S78). That is, the AP 121 may control to increase a refresh operation period of the cold memory bank, as described above.

Figure 8:
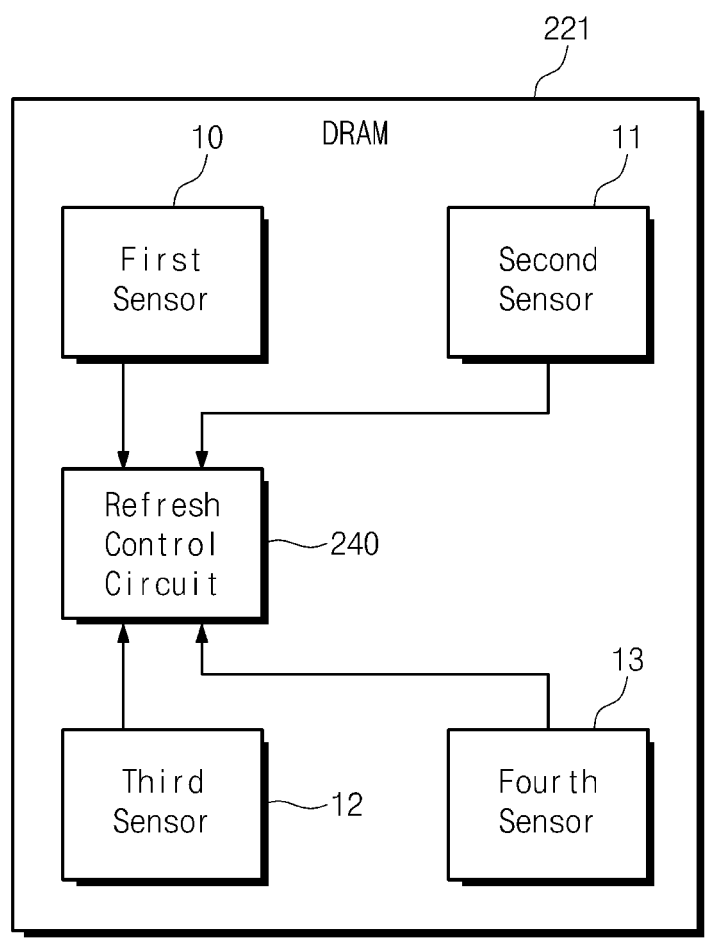
FIG. 8 illustrates a layout concept of thermal sensors mounted on a DRAM according to some embodiments.

FIG. 8 illustrates a layout concept of thermal sensors mounted on a DRAM according to some embodiments. In FIG. 8, four thermal sensors 10, 11, 12, and 13 arranged at a DRAM 221 as an example. The four thermal sensors 10, 11, 12, and 13 may be arranged above, below, beside or within the second substrate 210 in FIG. 1 as semiconductor temperature sensors.

As described in FIG. 6, the refresh control circuit 240 controlling an auto-refresh operation and a self-refresh operation is connected to the thermal sensors 10, 11, 12, and 13 and configured to receive temperature data from those thermal sensors 10, 11, 12, and 13. Thus, the refresh control circuit 240 may internally decide a refresh operation period according to a temperature at each memory bank. In this case, the hot data collection cannot be performed but power consumption in a refresh operation may be reduced.

The refresh control circuit 240 may be configured to transmit the sensed temperature data to the AP 121 through a data line or a communication line. In this case, the operation control flow may be performed as shown in FIG. 7. Thus, power consumption caused by the hot data collection may be minimized or reduced.

Figure 9:
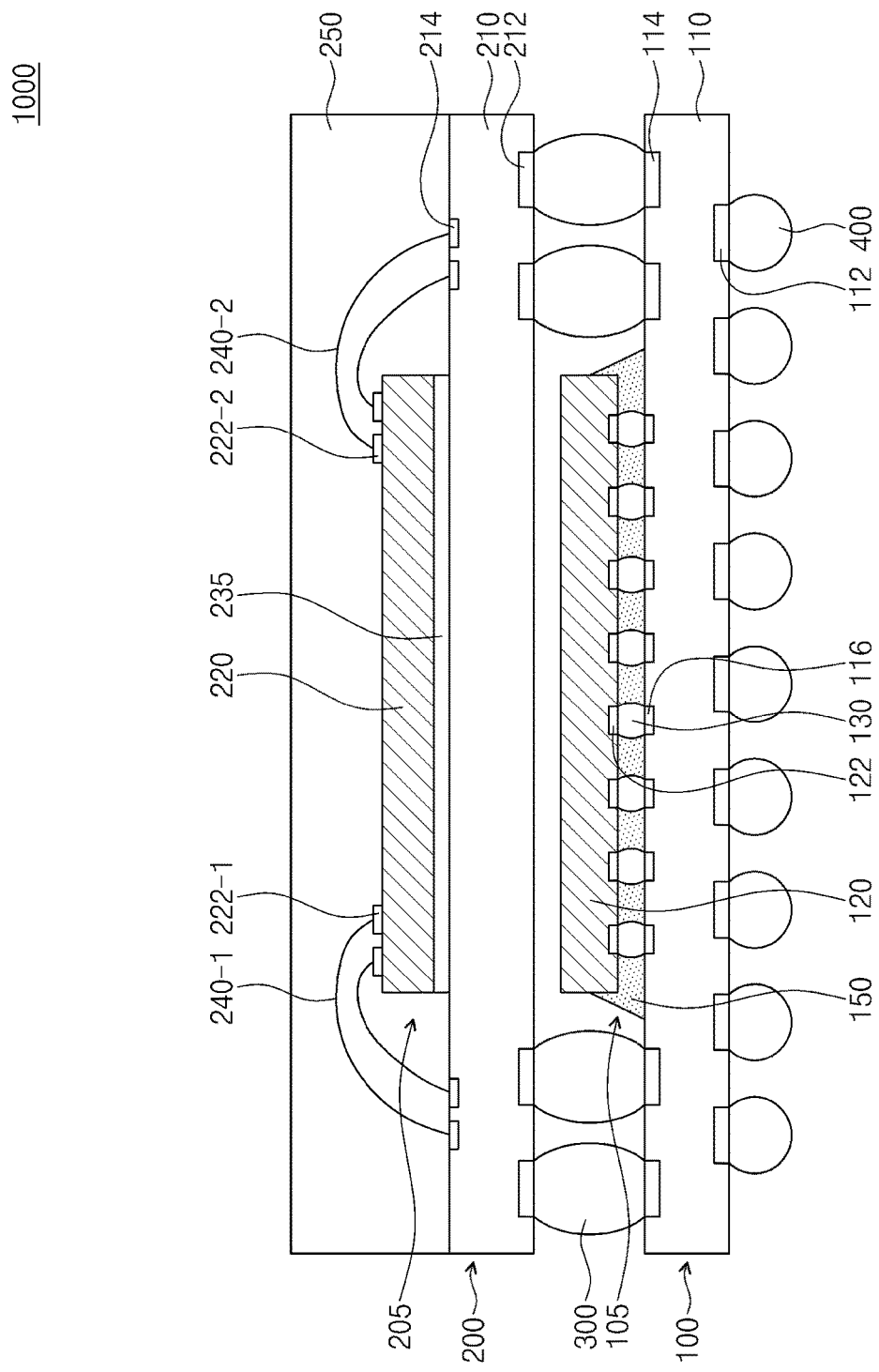
FIG. 9 is a detailed view of the semiconductor package with the PoP structure according to FIG. 1.

FIG. 9 is a cross-sectional view of the semiconductor package 1000 with the PoP structure according to FIG. 1. As illustrated, the semiconductor package 1000 may include a first package 100 and a second package 200. The semiconductor package 1000 may include a connection member 300 between substrates 110 and 210. The semiconductor package 1000 may have a package-on-package (PoP) structure where the second package 200 is stacked on the first package 100, as shown in the drawing.

The first package 100 may include a first substrate 110 and a first semiconductor chip portion 105. The first substrate 110 may support the first semiconductor chip portion 105, and pads may be formed on a bottom surface and a top surface of the first substrate 110. For example, a bottom pad 112 may be formed on the bottom surface of the first substrate 110 and a top pad 114 and an intermediate pad 116 may be formed on the top surface of the first substrate 110. The first substrate 110 may be formed of silicon, glass, ceramic or plastic. It will be understood that the material of the first substrate 110 is not limited to the above materials and may be different in other embodiments.

The first substrate 110 may be formed based on an active wafer or an interposer substrate. The active wafer means a wafer, such as a silicon wafer, on which a semiconductor chip may be formed. The first substrate 110 may include a multi-layered structure in which interconnection patterns are formed. The top pad 114 and the intermediate pad 116 may be electrically connected to the bottom pad 112 through the interconnection patterns. An external connection member 400 may be formed on the bottom pad 112 on the bottom surface of the first substrate 110 to mount a semiconductor package on an external device.

The first semiconductor chip portion 105 may include a first semiconductor chip 120, the connection member 130, and an underfill 150.

A chip pad 122 may be formed on a bottom surface of the first semiconductor chip 120, and the first semiconductor chip 120 may be mounted on the first substrate 100 through the connection member 130 bonded to the chip pad 122 in a flip-chip fashion. That is, the connection member 130 may physically and electrically connect the chip pad 122 and the intermediate pad 116 to each other. The underfill 150 may fill a space between the first semiconductor chip 120 and the first substrate 110. The underfill 150 may be formed of an underfill resin such as an epoxy resin and include a silica filler or a flux. In certain embodiments, instead of the underfill 150, an adhesive member may be formed between the first semiconductor chip 120 and the first substrate 110. The adhesive member may be a non-conductive film (NCF), an anisotropic conductive film (ACF), a UV film, an instant adhesive, a thermosetting adhesive, a laser hardening adhesive, an ultrasonic hardening adhesive or a non-conductive paste (NCP). However, in other embodiments, other adhesive members may be used.

The second package 200 may include a second substrate 210, a second semiconductor chip portion 205, and an encapsulant 250.

Similar to the first substrate 110, the second substrate 210 may be formed of silicon, glass, ceramic or plastic; however, a material of the second substrate 210 is not also limited to these materials. Pads may be formed on a top surface and a bottom surface of the second substrate 210. That is, a bonding pad 214 may be formed on the top surface of the second substrate 210 and a connection pad 212 may be formed on the bottom surface of the second substrate 210. The second substrate 210 may also have a multi-layered structure in which interconnection patterns are formed.

The bonding pad 214 may be electrically connected to the connection pad 212 through the interconnection patterns. The second semiconductor chip portion 205 may include a second semiconductor chip 220 and an adhesive 235. Chip pads 222-1 and 222-2 may be formed on a top surface of the second semiconductor chip 220. The chip pads 222-1 and 222-2 may be separated depending on channels to be disposed at one side of the edge of the second semiconductor chip 220 and the other side opposite to the one side of the edge. For example, the chip pads 222-1 and 222-2 may be separated depending on channels to be disposed at the right edge and the left edge of the second semiconductor chip 220.

The chip pads 222-1 and 222-2 may be electrically connected to the bonding pad 214 through wires 240-1 and 240-2. That is, the second semiconductor chip 220 may be mounted on the second substrate 210 in a wire-bonding fashion. Reference numerals of left and right chip pads and wires are different from each other, which is aimed to exemplarily show that the left chip pads 222-1 and wires 240-1 may correspond to a first channel and the right chip pads 222-2 and wires 240-2 may correspond to a second channel. A channel and chip pad arrangement structure will be described later.

The adhesive 235 may serve to fix the second semiconductor chip 220 to the second substrate 210. The adhesive 235 may be, for example, an NCF, a UV film, an instant adhesive, a thermosetting adhesive, a laser hardening adhesive, an ultrasonic hardening adhesive or an NCP; however, in other embodiments, the adhesive 235 may include a different material.

The encapsulant 250 serves to encapsulate the second semiconductor chip 220 and the wires 240-1 and 240-2. The encapsulant 250 may be formed of a resin or polymer. For example, the encapsulant 250 may be formed of an epoxy molding compound (EMC).

An inter-substrate connection member 300 may serve to physically and electrically connect the top pad 114 of the first substrate 110 to the connection pad 212 of the second substrate 210 and structurally and tightly fix the first package 100 and the second package 200. The inter-substrate connection member 300 may be formed of, for example, a solder ball. However, a material of the inter-substrate connection member 300 is not limited to the solder ball and may be different in other embodiments. For example, the inter-substrate connection member 300 may include at least one of tin (Sn), silver (Ag), copper (Cu), and aluminum (Al). A structure of the inter-substrate connection member 300 is not limited to a ball type as shown in the drawing. For example, the inter-substrate connection member 300 may have various types such as cylinder, polyprism, and polyhedron. The inter-substrate connection member 300 may be formed of not one solder ball but two or more solder balls. For example, the inter-substrate connection member 300 may have a structure where a bottom solder ball and a top solder ball are connected to each other.

In the semiconductor package shown in FIG. 9, each of the first and second semiconductor chip portions 105 and 205 includes only one semiconductor chip. However, some embodiments are not limited thereto and it will be understood that at least one of the first and second semiconductor chip portions 105 and 205 may include multiple semiconductor chips.

In the semiconductor package shown in FIG. 9, the first and second semiconductor chips 120 and 220 may be the same type or different types. For example, the first semiconductor chip 120 may be a logic chip and the second semiconductor chip 220 may be a memory chip.

In the semiconductor chip shown in FIG. 9, chip pads of the second semiconductor package 220, e.g., a DDR chip, are separated depending on channels to be disposed at both edges. Thus, a connection relationship between the second semiconductor chip 220 and the underlying first semiconductor chip 120, e.g., an AP chip may be simplified to decrease thickness of a second substrate and decrease thickness of the overall semiconductor package. As a result, temperature sensing for controlling hot data collection and a refresh operation may be more precisely performed.

In the configuration shown in FIG. 9, when a heating value of the first semiconductor chip 120 is greater than a heating allowable temperature, a heat sink or a cooling system may be mounted above or below the first semiconductor chip 120. A copper plane for temperature radiation may be mounted below the first semiconductor chip 120.

Communication between the first semiconductor chip 120 and the second semiconductor chip 220 may be performed not only via the connection member 300 but also via optical communication or magnetic coupling. The communication using magnetic coupling is a type of communication for transmitting and receiving data not using physical connection means but using magnetic force. In case of the optical communication, an optical cable, a photodiode, and a laser diode may be used; however, other optical interconnections may be used.

Figure 10:
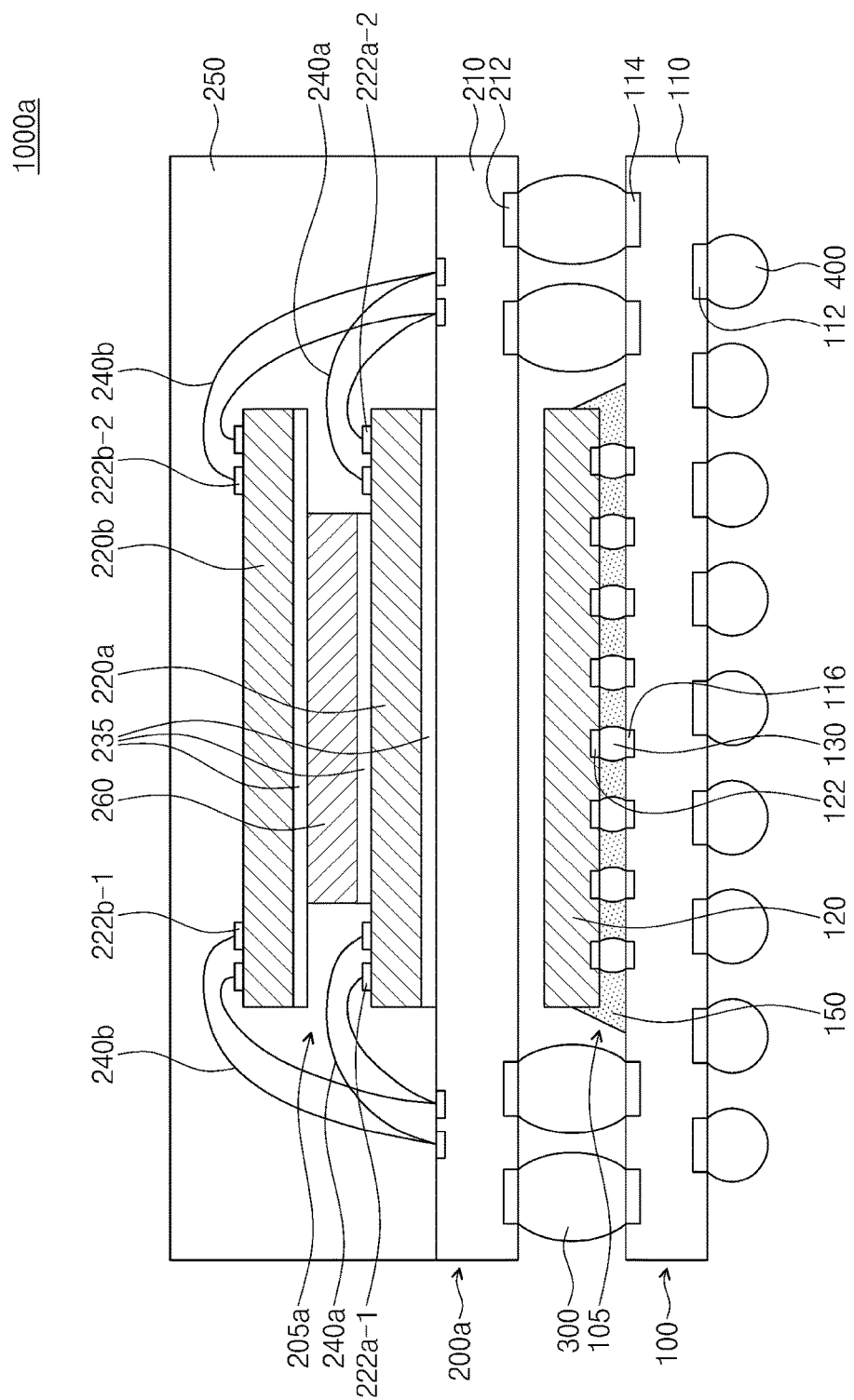
FIG. 10 illustrates a semiconductor package with a PoP structure according to some embodiments.

FIG. 10 illustrates a semiconductor package 1000*a* with a PoP structure according to some embodiments. For brevity of description, duplicate descriptions for contents which are the same as described in FIG. 9 will be omitted.

As illustrated in FIG. 10, the semiconductor package 1000*a* may be identical or similar to the semiconductor package 1000 in FIG. 9 except for a second package 200*a*. More specifically, the second package 200*a* may include two semiconductor chips 220*a* and 220*b*, i.e., a 2-1 semiconductor 220*a* and a 2-2 semiconductor chip 220*b* that are stacked to be mounted on a second substrate 210.

The 2-1 semiconductor chip 220*a* and the 2-2 semiconductor chip 220*b* may have the same structure, as shown in the drawing. Thus, the 2-1 semiconductor chip 220*a* and 2-2 semiconductor chip 220*b* may include chip pads formed at their both edges depending on channels, respectively. That is, a 1-1 chip pad 222*a*-1 corresponding to a first channel may be disposed at a left edge of the 2-1 semiconductor chip 220*a*, and a 2-1 chip pad 222*a*-2 corresponding to a second channel may be disposed at a right edge of the 2-1 semiconductor chip 220*a*. A 1-2 chip pad 220*b*-1 corresponding to the first channel may be disposed at a right edge of the 2-2 semiconductor chip 220*b*, and a 2-2 chip pad 222*b*-2 corresponding to the second channel may be disposed at a right edge of the 2-2 semiconductor chip 220*b*.

The 1-1 chip pad 222*a*-1 and the 1-2 chip pad 222*b*-1 may be connected to a first channel bonding pad 214 disposed at a left side of the second substrate 210 through corresponding wires 240*a* and 240*b*, respectively. The 2-1 chip pad 222-*a* and the 2-2 chip pad 222*b*-2 may be connected to a second channel bonding pad 214 disposed at a right side of the second substrate 210 through corresponding wire 240*a* and 240*b*, respectively.

The 2-2 semiconductor chip 220b may be stacked on the 2-1 semiconductor chip 220a with an interposer 260 interposed therebetween. The 2-1 semiconductor chip 220a, the interposer 260, and the 2-2 semiconductor chip 220b may be fixed onto the second substrate 210, the 2-1 semiconductor chip 220a, and the interposer 260 using an adhesive 235, respectively. In certain example embodiments, the 2-2 semiconductor chip 220b may be stacked directly on the 2-1 semiconductor chip 220a without the interposer 260. When the 2-2 semiconductor chip 220b is stacked directly on the 2-1 semiconductor chip 220a, the adhesive 235 may be formed thickly on the 2-1 semiconductor chip 220a to secure a wire bonding space of the 2-1 semiconductor chip 220a.

The 2-1 semiconductor chip 220a and the 2-2 semiconductor chip 220b may be the same type of memory chips or different types of memory chips. For example, both the 2-1 semiconductor chip 220a and the 2-2 semiconductor chip 220b may be DDR chips. The 2-1 semiconductor chip 220a and the 2-2 semiconductor chip 220b may be stacked and share a channel to increase memory capacity of a semiconductor package.

In the semiconductor package shown in FIG. 10, a structure where two semiconductor chips are stacked is shown. However, other embodiments are not limited thereto. For example, three or more semiconductor chips may be stacked on a second substrate. It will be understood that respective pads may be connected to bonding pads of the second substrate in the manner of sharing a channel, as shown in FIG. 10.

Figure 11:
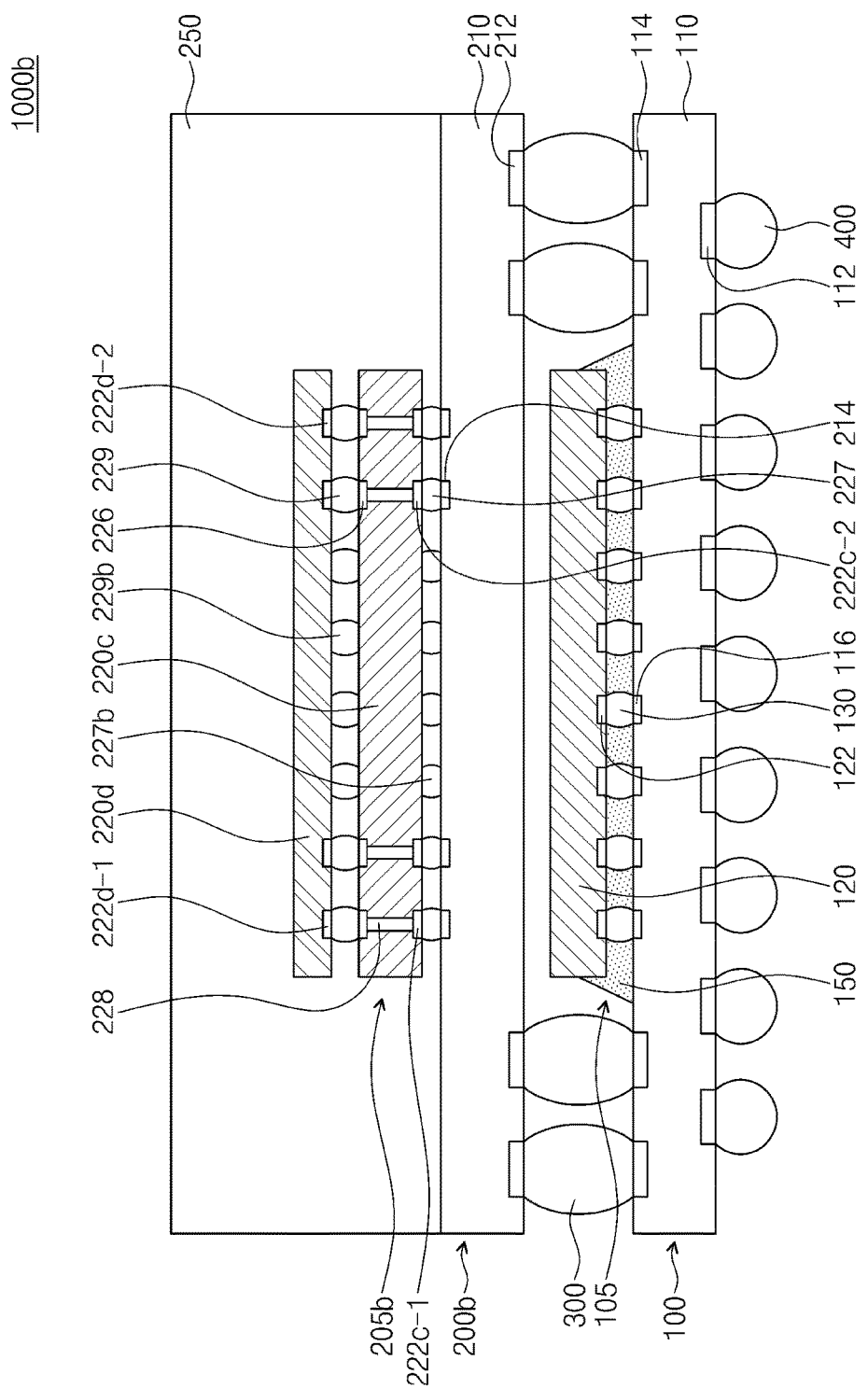
FIG. 11 illustrates a semiconductor package with a PoP structure according to some embodiments.

FIG. 11 illustrates a semiconductor package 1000b with a PoP structure according to some embodiments. The semiconductor package 1000b may be identical or similar to the semiconductor package 1000 except for a second package 200b.

The second package 200b may include two semiconductor chips 220c and 220d, i.e., a 2-1 semiconductor chip 220c and a 2-2 semiconductor chip 220d stacked to be mounted on a second substrate 210.

The 2-1 semiconductor chip 220c and the 2-2 semiconductor chip 220d may be mounted on the second substrate 210 in a flip-chip fashion. Thus, the 2-1 semiconductor chip 220c and the 2-2 semiconductor chip 220d may be stacked such that an active surface on which chip pads are formed faces toward the second substrate 210.

More specifically, a 1-1 chip pad 222c-1 corresponding to a first channel may be formed on a left active surface of the 2-1 semiconductor chip 220c and a 2-1 chip pad corresponding to a second channel may be formed on a right active surface of the 2-1 semiconductor chip 220c. The 1-1 chip pad 220c-1 and the 2-1 chip pad 220c-2 may each be connected to a corresponding bonding pad 214 of the second substrate 210 through a first connection member 227, e.g., a bump. A through-silicon via (TSV) 228 is formed at the 2-1 semiconductor chip 220c. The TSV 228 may electrically connect a top pad 226 of the 2-1 semiconductor chip 220c and the chip pads 222c-1 and 222c-2 to each other.

A 1-2 chip pad 222d-1 corresponding to the first channel may be formed on a left active surface of the 2-2 semiconductor chip 220d, and a 2-2 chip pad 222d-2 corresponding to the second channel may be formed on a right active surface of the 2-2 semiconductor chip 220d. The 1-2 chip pad 222c-1 and the 2-2 chip pad 222d-2 may each be connected to a corresponding top pad 226 of the 2-1 semiconductor chip 220c through a second connection member 229, e.g., a bump. As a result, the 1-2 chip pad 222c-1 and the 2-2 chip pad 222d-2 of the 2-2 semiconductor chip 220d may be electrically connected to a corresponding bonding pad 214 of the second substrate 210 through the second connection member 229, the TSV 228, and the first connection member 227.

In the semiconductor package shown in FIG. 11, chip pads are disposed at both edges of the semiconductor chips 220c and 220d mounted on the second substrate 210 to simplify an interconnection connection relationship with an underlying first semiconductor chip 120. Thus, the second substrate 210 may be kept thin. Although two semiconductor chips are stacked on the second substrate 210, the number of stacked semiconductor chips is not limited thereto. For example, three or more semiconductor chips may be stacked. A TSV may be formed at underlying semiconductor chips including, but not necessarily an uppermost semiconductor chip to stack the semiconductor chips in a flip-chip fashion. Connection members, which are not connected to the chip pads, may be dummy connection members 227b and 229b to simply support and fix semiconductor chips.

Figure 12:
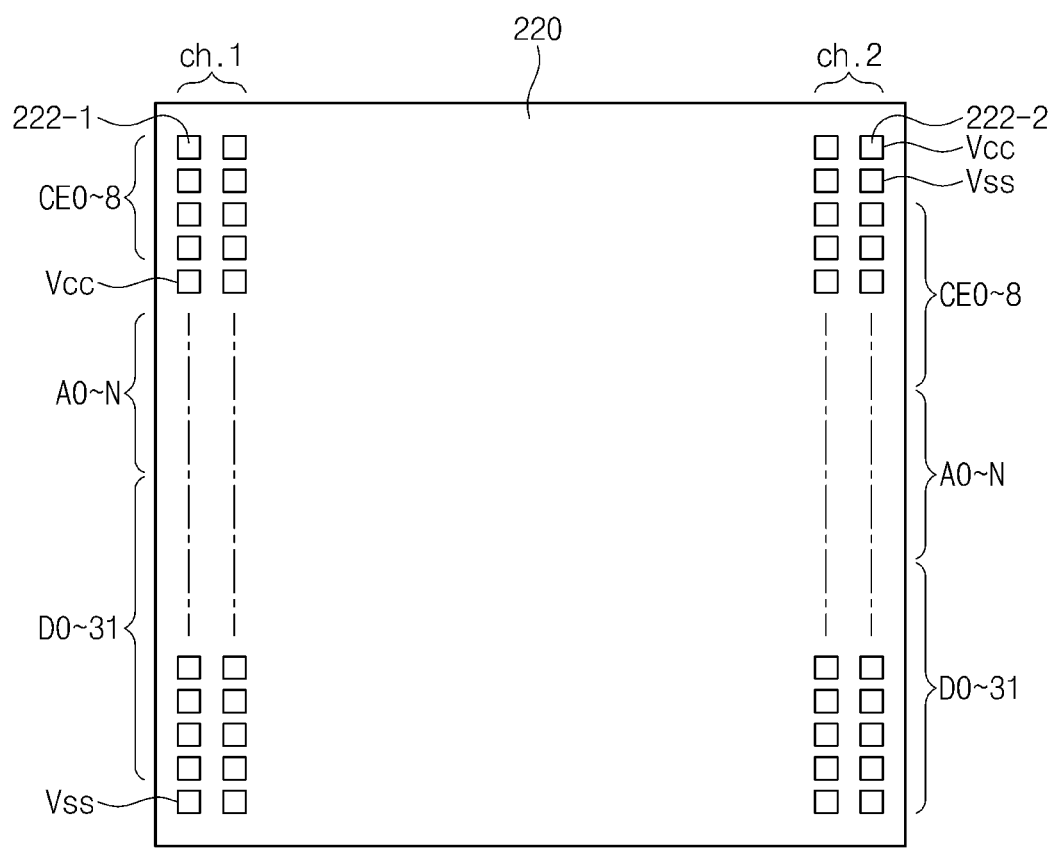
FIG. 12 is a top plan view showing chip pad arrangement according to FIG. 9.

FIG. 12 is a top plan view showing chip pad arrangement according to FIG. 9. In FIG. 12, the chip pad arrangement depending on channels of a semiconductor chip mounted on a second package of the semiconductor package in FIG. 9 is shown in a plan view.

Referring to FIG. 12, a second semiconductor chip included in a semiconductor package according to some embodiments may be the above-mentioned DDR chip. In the second semiconductor chip 220, first chip pads 222-1 for a first channel Ch.1 and second chip pads 222-2 for a second channel Ch.2 may be formed at a left edge and a right edge.

Each of the first and second channels Ch.1 and Ch.2 is a channel for 32 bits; however, in other embodiments, the number of bits may be different Accordingly, the first and second chip pads 222-1 and 222-2 may each include address terminal pads A0 to AN, control terminal pads CE0 to CE8, and data terminal pads D0 to D31 to input and output 32 bits of data. Each of the first and second chip pads 222-1 and 222-2 may include a power supply voltage terminal Vcc for applying a power supply voltage and a ground terminal Vss for applying a ground voltage.

As described above, since 32 bits of data is input and output through a first channel and a second channel, the second semiconductor chip 220, i.e., a DDR chip may be a 64-bit DDRA chip.

In the drawing, the first chip pads 222-1 and the second chip pads 222-2 are arranged at left and right edges in two columns, respectively. However, the arrangement of the first chip pas 222-1 and the second chip pads 222-2 is not limited thereto. For example, the first chip pads 222-1 and the second chip pads 222-2 may each be arranged in one column or three or more columns. The arrangement order of the address terminal pads A0 to AN, the control terminal pads CE0 to CE8, and the data terminal pads D0 to D31 may be random or in other groupings. In the drawing, the address terminal pads A0 to An, the control terminal pads CE0 to CE8, and the data terminal pads D0 to D31 of the first chip pads 222-1 are not symmetrical to the address terminal pads A0 to An, the control terminal pads CE0 to CE8, and the data terminal pads D0 to D31 of the second chip pads 222-2. However, it will be understood that they may be symmetrically arranged. Only one power supply voltage terminal Vcc and only one ground terminal Vss are disposed both at the first chip pads 222-1 and at the second chip pads 222-2. However, other embodiments are not limited thereto and multiple power supply voltage terminals and multiple ground terminals may be included.

In the above-described semiconductor package, chip pads of the second semiconductor chip 220 are disposed on both edges after being separated depending on channels for 32 bits. Thus, an interconnection connection relationship with the first semiconductor chip may be made more easy. As a result, chips pads for 32 bits where two channels correspond to one DDR chip are disposed at both sides of the DDR chip and a DDR IP core portion corresponding to each channel of an AP chip are disposed at sides adjacent to chip pads to significantly simplify an interconnection connection relationship between the DDR chip and the AP chip. Accordingly, thickness of a substrate on which the DDR chip is mounted may be reduced and the number of DDR chips may decrease in half. For example, when four channels are used, two DDR chips each including chip pads for two channels may be stacked to implement a four-channel semiconductor package.

Figure 13:
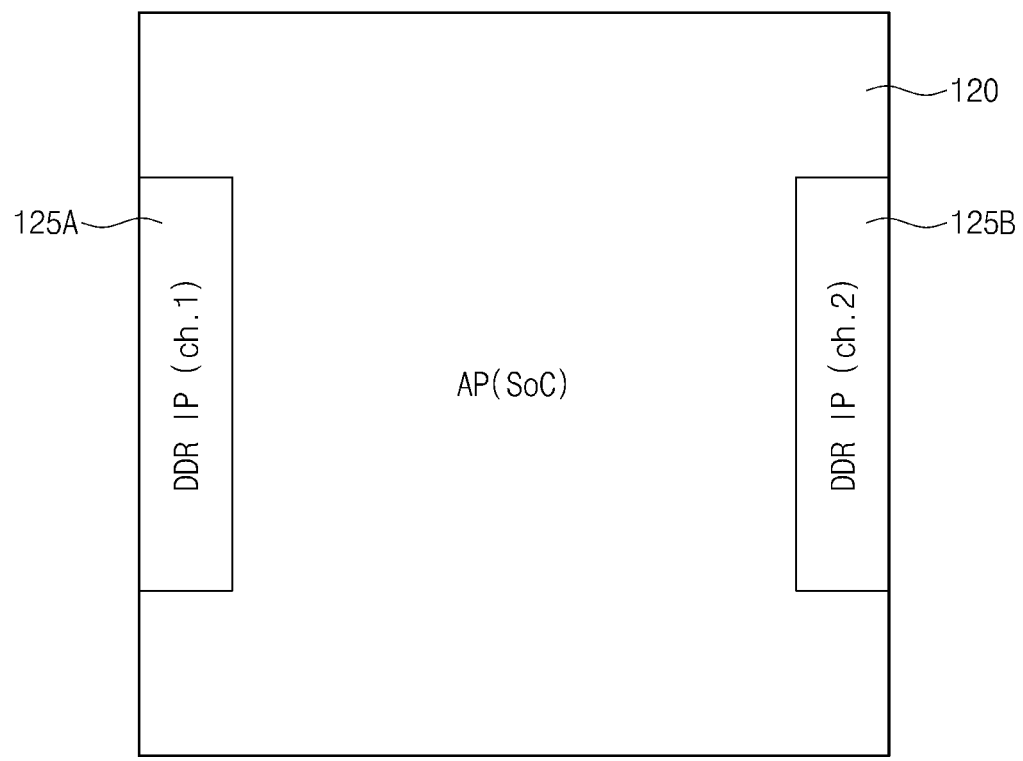
FIG. 13 is a top plan view showing arrangement of a DDR IP core according to FIG. 9.

FIG. 13 is a top plan view showing arrangement of a DDR IP core according to FIG. 9. In FIG. 13, a DDR IP core position depending on a channel of a semiconductor chip mounted on a first package of the semiconductor package in FIG. 9 is shown in a plan view.

In a semiconductor package 1000 according to some embodiments, DDR IP cores 125A and 125B in a first semiconductor chip 120, i.e., an AP chip may be disposed to correspond to chip pads disposed at a second semiconductor chip 220, i.e., a DDR chip. To put it another way, the DDR IP core 125A for a first channel may be disposed at the left edge of a chip to correspond to chip pads of a first channel Ch.1, and the DDR IP core 125B for a second channel may be disposed at the right edge of the chip to correspond to chip pads of a second channel Ch.2. Thus, an interconnection connection relationship between chip pads of a DDR chip and an AP chip of chip pads may be further simplified.

Figure 14:
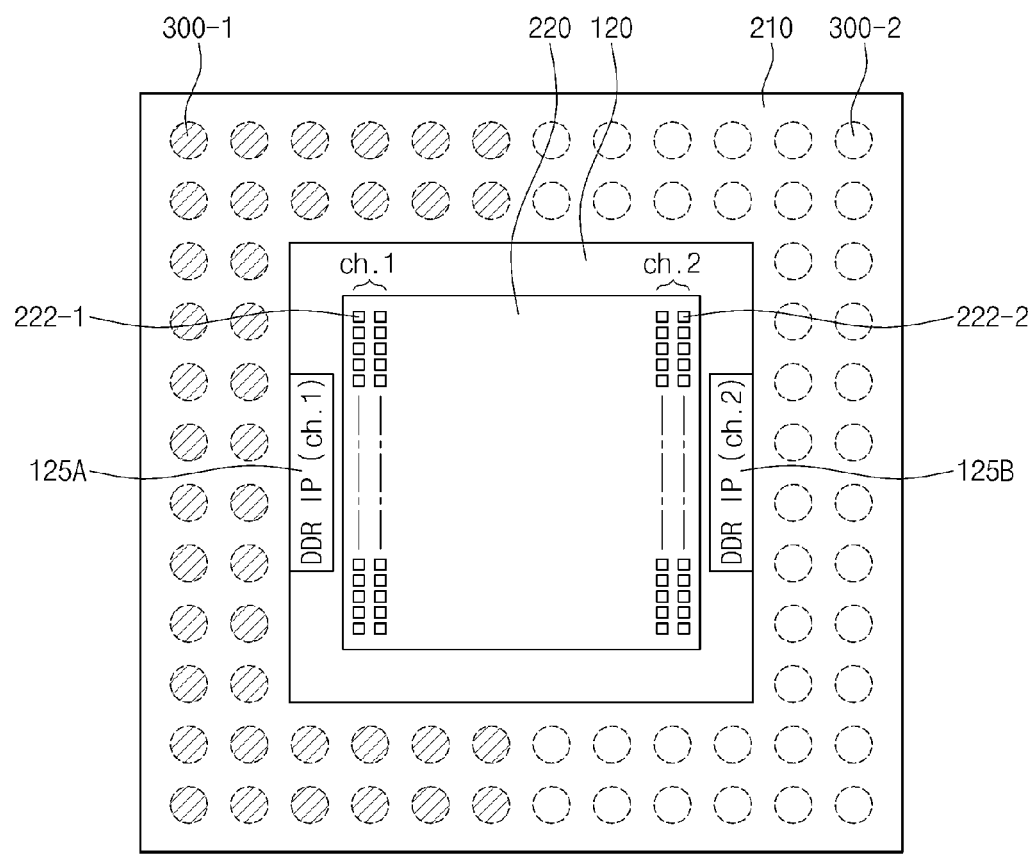
FIG. 14 is a schematic chip pad arrangement view according to FIG. 9.

FIG. 14 is a schematic chip pad arrangement view according to FIG. 9. In FIG. 14, relative geometric relationships of a chip pad on a second package, a DDR IP core of a semiconductor chip on a first package, and a connection member disposed on a bottom surface of a second substrate are shown in a plan view.

In a semiconductor package 1000 according to some embodiments, a DDR IP core 125A for a first channel of a first semiconductor chip 120 may be disposed adjacent to chip pads 222-1 for the first channel of a second semiconductor chip 120. A DDR IP core 125B for a second channel of the first semiconductor chip 120 may be disposed adjacent to chip pads 222-2 for the second channel.

An inter-substrate connection member 300 disposed at a second substrate 210 on which a second semiconductor chip 220 is mounted is shown in the form of dotted circles. A left hatched portion may indicate an inter-substrate connection member 300-1 corresponding to the first channel, and an unhatched portion may indicate an inter-substrate connection member 300-2 corresponding to the second channel.

In FIG. 9, the first semiconductor chip 120 is shown to be greater than the second semiconductor chip 220, which is aimed to explain a geometric relationship between chip pads and DDR IP cores. Therefore, the first semiconductor chip 120 may be smaller than or equal to the second semiconductor chip 220. As can be seen from FIG. 9, since the first semiconductor chip 120 is mounted on the first substrate 110, it is disposed below the second substrate 210. However, for brevity of description, the first semiconductor chip is shown together with the second semiconductor chip 220 on the second substrate 210 in FIG. 14.

Figure 15:
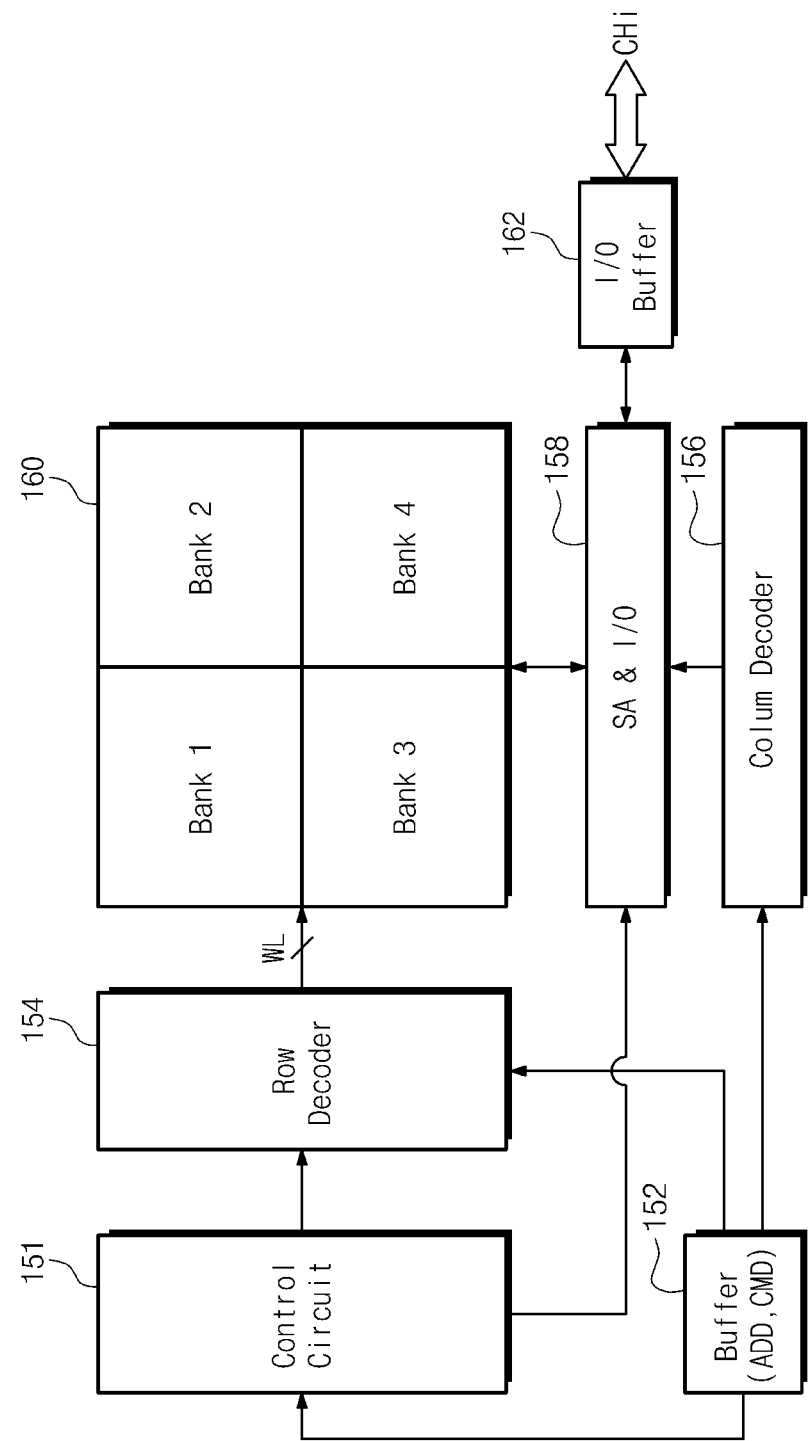
FIG. 15 is an exemplary circuit block diagram of a DRAM in FIG. 3.

FIG. 15 is an exemplary circuit block diagram of a DRAM in FIG. 3. As illustrated, the DRAM may include a memory cell array 160, a sense amplifier and input/output circuit (SA & I/O) 158, an input/output (I/O) buffer 162, a buffer 152, a row decoder 154, a column decoder 156, and a control circuit 151.

The memory cell array 160 may include DRAM memory cells each including a single access transistor and a single storage capacitor. The memory cells may be arranged in a matrix of rows and columns. Although the memory cell array 160 is divided into four banks, it is merely exemplary and the memory cell array 160 may be designed with two or more banks.

The control circuit 151 may be configured to receive an applied control signal and an applied address to generate an internal control signal to control set operation modes. The control circuit 151 may include a refresh control circuit 240 as shown in FIG. 8.

The buffer 152 may be configured to receive the applied address to perform buffering. In response to the internal control signal, the buffer 152 may be configured to provide a row address to select a row of the memory cell array 160 to the row decoder 154 and provide a column address to select a column of the memory cell array 160 to the column decoder 156.

The buffer 152 may be configured to receive an applied command to perform buffering. The command is applied to the control circuit 151 to be decoded.

The row decoder 154 may be configured to decode the row address in response to the internal control signal. When a result of the row address decoding is applied to the memory cell array 160, a selected one of wordlines connected to memory cells is driven. Thus, one of wordlines in an activated memory bank may be selected.

The column decoder 156 may be configured to decode the column address in response to the internal control signal. Column gating is performed according to the decoded column address. As a result of performing the column gating, a selected one of bitlines connected to memory cells is driven.

The sense amplifier and input/output circuit (SA & I/O) 158 may be configured to detect a potential appearing on a bitline of a selected memory cell to sense data stored in the selected memory cell.

The I/O buffer 162 may be configured to buffer input/output data. In a read operation mode, the I/O buffer 162 may be configured to buffer data read out from the sense amplifier and input/output circuit (SA & I/O) 158 and output the buffered data to a channel CHi.

When a DRAM shown in FIG. 5 is packaged into a semiconductor package with a PoP structure, hot data collection and a refresh operation may be performed to achieve lower power consumption.

Figure 16:
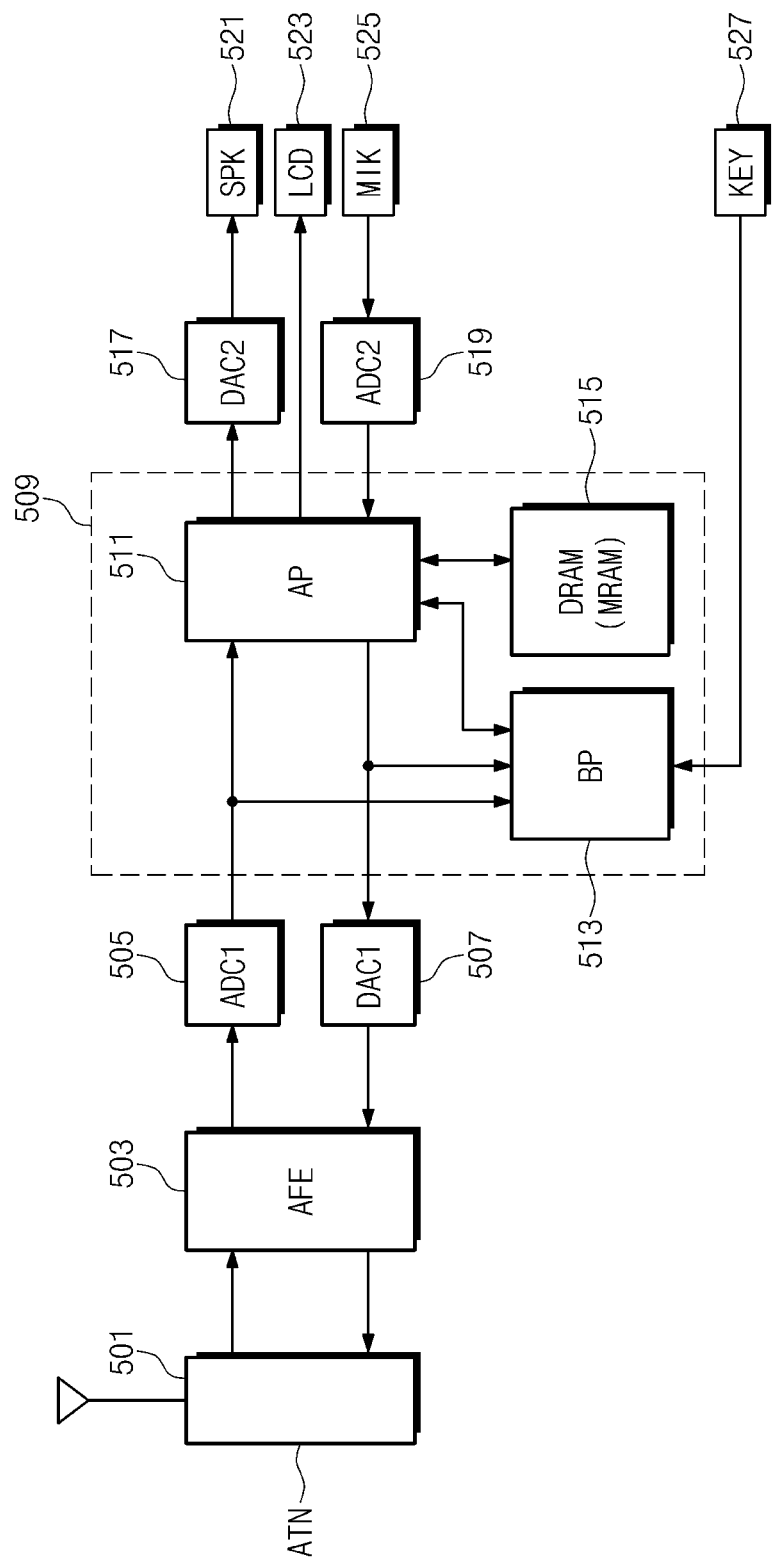
FIG. 16 is a block diagram of an electronic device according to some embodiments.

FIG. 16 is a block diagram of an electronic device according to some embodiments. In FIG. 16, an exemplary block diagram of an electronic device, e.g., a handheld phone is shown. The electronic device may include an antenna (ATN) 501, an analog front end block (AFE) 503, analog-to-digital converters (ADC1 and ADC2) 505 and 519, digital-to-analog converters (DAC1 and DAC2) 507 and 517, a data processing block 509, a speaker (SPK) 521, a liquid crystal monitor (LCD) 523, a microphone (MIK) 525, and an input key (KEY) 527.

The analog front end block 503 is a circuit block that includes an antenna switch, a band pass filter, various amplifiers, a power amplifier, a phase locked loop (PLL), a voltage controlled oscillator (VCO), an orthogonal demodulator, an orthogonal modulator, etc. and may be configured to transmit and receive radio waves.

The data processing block 508 may include an AP 511, a baseband processor (BP) 513, and a DRAM 515.

When an input including voice and character information is received, a radio wave input from the antenna (ATN) 501 is provided to the analog-to-digital converter (ADC1) 505 through the analog front end block (AFE) 503 to perform waveform equalization and analog-to-digital conversion. An output signal of the analog-to-digital converter (ADC1) 505 is provided to the baseband processor (BP) 513 and a signal processing circuit to perform voice and image processing. A voice signal is provided to the speaker (SPK) 521 from the digital-to-analog converter (DAC2) 517, and an image signal is transmitted to the liquid crystal monitor (LCD) 523 from the digital-to-analog converter (DAC2) 517.

When a voice signal is transmitted, a signal input from the microphone (MIK) 525 is provided to the data processing block 509 through the analog-to-digital converter (ADC2) 519 to perform voice processing. An output of the data processing block 509 is transmitted to the antenna (ATN) 501 through the digital-to-analog converter (DAC1) 507 and the analog front end block (AFE) 503. When character information is transmitted, a signal input from the input key (KEY) 527 is provided to the antenna (ATN) 501 through the data processing block 509, the digital-to-analog converter (DAC1) 507, and the analog front end block (AFE) 503.

In FIG. 16, the DRAM 515 and the AP 511 may be formed with a semiconductor package with a PoP structure. In this case, hot data collection and refresh control for the AP 511 and the DRAM 515 may be performed as described above. Thus, power consumption of the electronic device may be reduced or minimized.

Although semiconductor products continue to decrease in volume, a user desires high-capacity data processing. Accordingly, there is a need for high integration and single packaging of semiconductor chips for use in such semiconductor products. In addition, there is an increasing need for improved low power consumption, improved operation performance, and improved reliability of semiconductor chips and high-speed operation of an electronic system including integrated semiconductor chips. Thus, the electronic device in FIG. 16 may meet these needs.

Although a DRAM 515 is connected as a memory in FIG. 6, a magnetic random access memory (MRAM) may be used instead of the DRAM in other cases. In this case, only a hot data collection operation may be performed to improve data reliability without refresh operation control.

Volatile memory devices such as SRAM and DRAM may lose their stored data when their power supplies are interrupted.

Meanwhile, nonvolatile memory devices such as MRAM retain their stored data even when their power supplies are interrupted. Accordingly, nonvolatile memory devices are preferentially used to store data when data does not want to be lost by power failure or power-off.

When a spin transfer torque magneto resistive random access memory (STT-MRAM) constitutes a memory module, advantages of an MRAM may be added to the advantages of a DRAM.

An STT-MRAM cell may include a magnetic tunnel junction (MTJ) element and a selection transistor. The MTJ element may basically include a pinned layer, a free layer, and a tunnel layer disposed therebetween. A magnetization direction of the free layer is fixed and may be identical or opposite to that of the pinned layer.

The electronic device shown in FIG. 16 may be provided as one of various components of an electronic device such as a computer, a ultra-mobile personal computer (UMPC), a digital picture player, a digital video recorder, a digital video player, a storage constituting a data center, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

Figure 17:
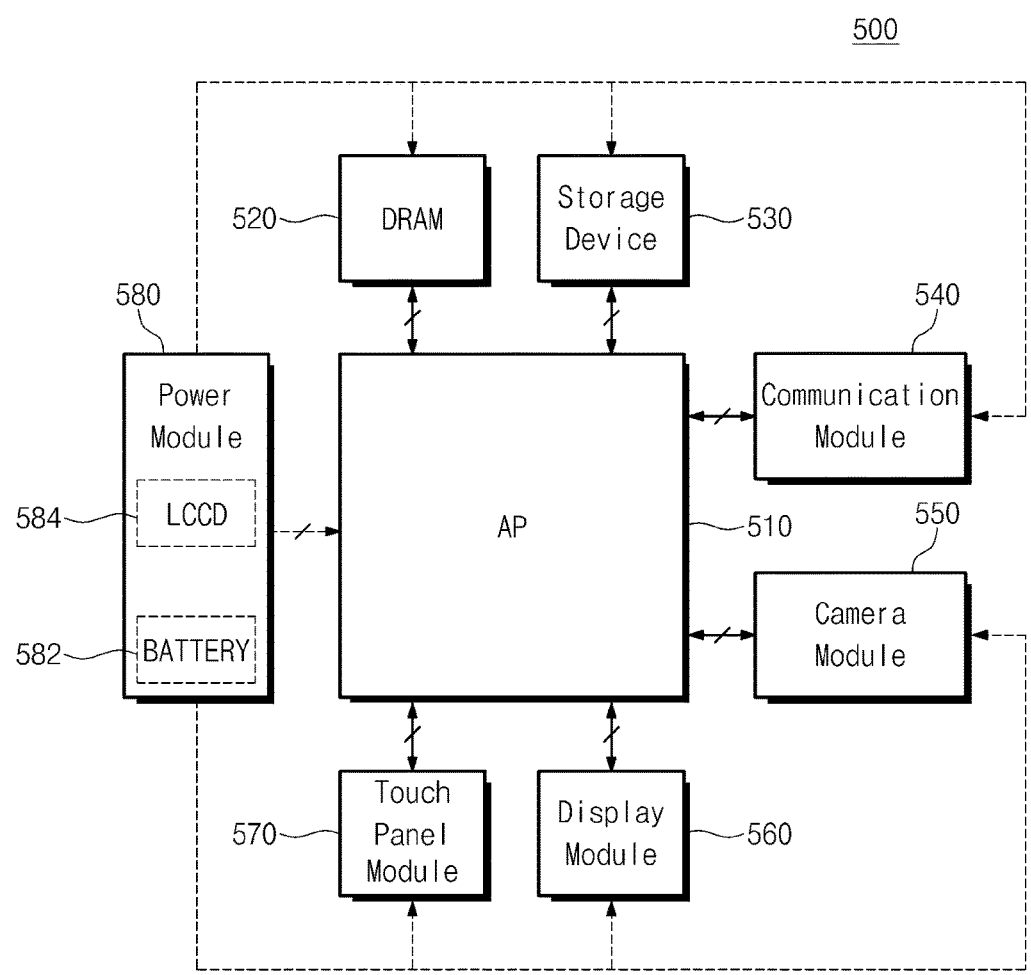
FIG. 17 is a block diagram of a handheld multimedia device according to some embodiments.

FIG. 17 is a block diagram of a handheld multimedia device 500 according to some embodiments. As illustrated, the handheld multimedia device 500 may include an AP 510, a DRAM 520, a storage device 530, a communication module 540, a camera module 550, a display module 560, a touch panel module 570, and a power module 580.

The AP 510 may be formed with an SoC type to perform a data processing function. The DRAM 520 may include a DDR SDRAM. When the DRAM 520 may be disposed above or below the AP 510 to form a semiconductor package with a PoP structure, hot data collection and refresh control may be performed on the DRAM 520, as described above. Thus, power consumption of the handheld multimedia device 500 may be reduced or minimized.

While the AP 510 and the DRAM 520 are packaged with a PoP structure, embodiments are not limited thereto. For example, a space between the AP 510 and the DRAM 520 or a space between other blocks in the drawing may be packaged by one of Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

The communication module 540 connected to the AP 510 may be configured to function as a modem to transmit/receive communication data and modulate/demodulate data.

The storage device 530 may be implemented with a nonvolatile storage to store high-capacity information.

The display module 560 may be implemented as a display unit such as a liquid crystal having backlight, a liquid crystal having a light emitting diode (LED) light source or an organic LED (OLED). The display module 560 may be configured to function as an output element to display images such as letters, numbers, and figures in color.

The nonvolatile storage 760 may be implemented with a nonvolatile storage to store high-capacity information. The nonvolatile storage may be, for example, an electrically erasable programmable read-only memory (EEPROM), a flash memory, a magnetic RAM (MRAM), a spin-transfer torque MRAM (STT-MRAM), CBRAM (a conductive bridging RAM (CBRAM), a ferroelectric RAM (FRAM), a phase change RAM (PRAM) called an ovonic unified memory (OUM), a resistive RAM (RRAM or ReRAM), nanotube RRAM, a nanotube RRAM, a polymer RAM (PoRAM), a nano floating gate memory (NFGM), holographic memory, a molecular electronics memory device or an insulator resistance change memory.

The touch panel module 570 may be configured to solely provide a touch input to the AP 510 or may provide the touch input to the AP 510 on the display module 560.

While the handheld multimedia device 500 has been described to focus on a mobile communication device, the multimedia device 500 may function as a smart card or any other device by adding or subtracting its components, if necessary.

The handheld multimedia device 500 may connect a separate interface to an external communication device. The communication device may be a digital versatile disc (DVD) player, a computer, a set top box (STB), a game player, a digital camcorder or the like.

The power module 580 may be configured to perform power management of the handheld multimedia device 500. As a result, when a PMIC scheme is applied into the multimedia device 500, power saving of the multimedia device 500 is achieved.

The camera module 550 may include a camera image processor (CIS) and is connected to the AP 510.

Although not shown in the figure, it will be understood by those skilled in the art that the handheld multimedia device 500 may further include another application chipset or a mobile DRAM.

According to the embodiments described above, power consumption caused by a refresh operation in a semiconductor package with a PoP structure is minimized or reduced.

An embodiment includes a semiconductor package with a PoP structure and a refresh control method thereof.

An embodiment includes a refresh control method of a semiconductor package with a PoP structure includes providing a semiconductor package with a PoP structure including a first package including a first semiconductor chip mounted on a first substrate and a second package including a second semiconductor chip mounted on a second substrate, monitoring a temperature depending on each of set sensing areas of the first semiconductor chip when the first semiconductor chip operates, deciding at least one memory bank of the second semiconductor chip corresponding to an area having the lowest temperature among the sensing areas, controlling the second semiconductor chip to transfer data stored in a memory bank except for the decided memory bank to the decided memory bank, and controlling a refresh operation of the second semiconductor chip such that a period of a refresh operation on the decided memory bank increases to be greater than that of a refresh operation on the memory bank except for the decided memory bank.

In some embodiments, a thermal sensor used to monitor the temperature may be provided in plurality between the first substrate and the first semiconductor chip.

In some embodiments, the second semiconductor chip may be a DRAM chip when the first semiconductor chip is a logic chip.

In some embodiments, the second semiconductor chip may be a mobile DRAM chips stacked in at least two layers when the first semiconductor chip is an application processor.

In some embodiments, the second semiconductor chip may be a DDR4 DRAM chip having a multi-chip package (MCP) structure using a silicon-through via (TSV) when the first semiconductor chip is an application processor implemented with a system-on-chip.

In some embodiments, an address mapping table to indicate a data transfer path may be managed when the second semiconductor chip is controlled to transfer data stored in a memory bank except for the decided memory bank to the decided memory bank.

In some embodiments, the address mapping table may be stored in a nonvolatile storage area in the first semiconductor chip and managed by software loaded to the first semiconductor chip.

An embodiment includes a refresh control method of a semiconductor package with a PoP structure includes providing a semiconductor package with a PoP structure including a first package including a first semiconductor chip and a second package including a second semiconductor chip as a memory chip, monitoring a temperature depending on each of set sensing areas of the second semiconductor chip when the first semiconductor chip operates as a system-on-chip, deciding at least one memory bank of the second semiconductor chip corresponding to an area having the lowest temperature among the sensing areas, controlling the second semiconductor chip to transfer data stored in a memory bank except for the decided memory bank to the decided memory bank, and controlling a refresh operation of the second semiconductor chip such that a period of a refresh operation on the decided memory bank is made longer than that of a refresh operation on a memory bank except for the decided memory bank.

An embodiment includes a semiconductor package with a PoP structure may include a first package including a first semiconductor chip, and a second package with a PoP structure including a second semiconductor chip as a memory chip including a plurality of memory banks. When the first semiconductor chip operates as a system-on-chip, the first semiconductor chip may monitor a temperature depending on each of set sensing areas of the second semiconductor chip, decide at least one memory bank of the second semiconductor chip corresponding to an area having the lowest temperature among the sensing areas, control the second semiconductor chip to transfer data stored in a memory bank except for the decided memory bank to the decided memory bank, and control a refresh operation of the second semiconductor chip such that a period of a refresh operation on the decided memory bank is made longer than that of a refresh operation on a memory bank except for the decided memory bank.

In some embodiments, a heating spot of the first semiconductor chip may be divided into a hot spot and a cold spot depending on an operation concentration state of an application processor having a system-on-chip (SoC) form.

In some embodiments, hot data of a memory bank corresponding to the host spot among the memory banks may be transferred to the decided memory bank to be treated as cold data. A refresh operation period of the cold data may be controlled to be longer than that of the hot data by the first semiconductor chip.

While embodiments have been particularly shown and described with reference to particular embodiments thereof, it will be understood by those of ordinary skill in the art that various changes in form and details may be made therein without departing from the spirit and scope as defined by the following claims. For example, it is possible to adjust a semiconductor memory including a DRAM by changing, adding, or removing the circuit configuration or arrangement in the drawings without departing from the technical spirit.

What is claimed is:

1. A refresh control method of a semiconductor package, comprising:
   providing a semiconductor package including a first semiconductor chip and a second semiconductor chip;
   monitoring a temperature of each of a plurality of sensing areas of the first semiconductor chip when the first semiconductor chip operates;
   identifying at least one memory bank of the second semiconductor chip in a position within the second semiconductor chip corresponding to a sensing area having a lower temperature among the sensing areas;

controlling the second semiconductor chip to transfer data to the identified memory bank from another memory bank of the second semiconductor chip; and controlling a refresh operation of the second semiconductor chip such that a period of a refresh operation on the identified memory bank is greater than that of a period of a refresh operation on the other memory bank.

2. The refresh control method as set forth in claim 1, wherein monitoring the temperature of each of the sensing areas of the first semiconductor chip comprises:

monitoring a plurality of thermal sensors disposed between the first semiconductor chip and a substrate on which the first semiconductor chip is mounted.

3. The refresh control method as set forth in claim 1, wherein monitoring the temperature of each of the sensing areas of the first semiconductor chip comprises:

monitoring a number of a thermal sensors disposed between the first semiconductor chip and a substrate on which the second semiconductor chip is mounted.

4. The refresh control method as set forth in claim 1, wherein the second semiconductor chip is a DRAM chip and the first semiconductor chip is a logic chip.

5. The refresh control method as set forth in claim 1, wherein the second semiconductor chip is one of multiple DRAM chips stacked in at least two layers and the first semiconductor chip is an application processor.

6. The refresh control method as set forth in claim 1, wherein the second semiconductor chip is a DDR4 DRAM chip having a multi-chip package (MCP) structure using a silicon-through via (TSV) and the first semiconductor chip is an application processor implemented with a system-on-chip.

7. The refresh control method as set forth in claim 1, further comprising:

controlling the second semiconductor chip to not perform a refresh operation on the other memory bank when the other memory bank is empty.

8. The refresh control method as set forth in claim 1, further comprising:

managing an address mapping table to indicate a data transfer path when the second semiconductor chip is controlled to transfer data stored in the other memory bank to the identified memory bank.

9. The refresh control method as set forth in claim 8, further comprising:

storing and managing the address mapping table in a nonvolatile storage area in the first semiconductor chip.

10. The refresh control method as set forth in claim 1, wherein the monitoring of the temperature in each of the sensing areas of the first semiconductor chip is performed in each of a plurality of predetermined monitoring periods.

11. The refresh control method as set forth in claim 1, wherein providing the semiconductor package including the first semiconductor chip and the second semiconductor chip comprises providing the semiconductor package including the first semiconductor chip and the second semiconductor chip in separate packages of the semiconductor package.

12. The refresh control method as set forth in claim 1, wherein the lower temperature is a lowest temperature of all of the sensing areas.

13. A refresh control method of a semiconductor package, the refresh control method comprising:

providing a semiconductor package including a first semiconductor chip and including a second semiconductor chip as a memory chip;

monitoring a temperature of each of a plurality of sensing areas of the second semiconductor chip when the first semiconductor chip operates as a system-on-chip;

identifying at least one memory bank of the second semiconductor chip corresponding to an area having a lower temperature among the sensing areas;

controlling the second semiconductor chip to transfer data stored in a memory bank other than the identified at least one memory bank to the identified at least one memory bank; and controlling a refresh operation of the second semiconductor chip such that a period of a refresh operation on the identified at least one memory bank is made longer than that of a refresh operation on the memory bank other than the identified at least one memory bank.

14. The refresh control method as set forth in claim 13, wherein the first semiconductor chip is an application processor and the second semiconductor chip is a DRAM.

15. The refresh control method as set forth in claim 13, wherein monitoring the temperature of each of the sensing areas of the second semiconductor chip comprises:

monitoring a plurality of thermal sensors disposed in a package on which the second semiconductor chip is mounted.

16. The refresh control method as set forth in claim 13, wherein each of the sensing areas corresponds to one or more of physical positions of memory banks of the second semiconductor chip.

17. The refresh control method as set forth in claim 13, further comprising:

controlling the second semiconductor chip to not perform a refresh operation on the memory bank other than the identified at least one memory bank when the memory bank other than the identified at least one memory bank is empty.

* * * * *